US011360399B2

(12) United States Patent
Goorden et al.

(10) Patent No.: US 11,360,399 B2
(45) Date of Patent: Jun. 14, 2022

(54) METROLOGY SENSOR FOR POSITION METROLOGY

(71) Applicant: ASML Netherlands B.V., Veldhoven (NL)

(72) Inventors: Sebastianus Adrianus Goorden, Eindhoven (NL); Simon Reinald Huisman, Eindhoven (NL); Simon Gijsbert Josephus Mathijssen, Rosmalen (NL); Henricus Petrus Maria Pellemans, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/277,353

(22) PCT Filed: Aug. 27, 2019

(86) PCT No.: PCT/EP2019/072762
§ 371 (c)(1),
(2) Date: Mar. 18, 2021

(87) PCT Pub. No.: WO2020/057900
PCT Pub. Date: Mar. 26, 2020

(65) Prior Publication Data
US 2022/0035257 A1   Feb. 3, 2022

(30) Foreign Application Priority Data

Sep. 19, 2018 (EP) .................................... 18195488
Jan. 3, 2019 (EP) .................................... 19150245

(51) Int. Cl.
*G03F 7/20* (2006.01)
(52) U.S. Cl.
CPC ........ *G03F 7/70633* (2013.01); *G03F 7/7065* (2013.01); *G03F 7/70583* (2013.01)

(58) Field of Classification Search
CPC . G03F 7/70633; G03F 7/70583; G03F 7/7065
See application file for complete search history.

(56) References Cited

U.S. PATENT DOCUMENTS 6,961,116 B2   11/2005  Den Boef et al.
9,778,025 B2   10/2017  Mathijssen et al.
(Continued)

FOREIGN PATENT DOCUMENTS

JP    H05-047628 A    2/1993
JP    2015-528584 A   9/2015
(Continued)

OTHER PUBLICATIONS

International Search Report and Written Opinion of the International Searching Authority directed to related International Patent Application No. PCT/EP2019/072762, dated Dec. 16, 2019; 9 pages.
(Continued)

*Primary Examiner* — Peter B Kim
(74) *Attorney, Agent, or Firm* — Sterne, Kessler, Goldstein & Fox P.L.L.C.

(57) ABSTRACT

Disclosed is a metrology device (1600) configured to produce measurement illumination comprising a plurality of illumination beams, each of said illumination beams being spatially incoherent or pseudo-spatially incoherent and comprising multiple pupil points in an illumination pupil of the metrology device. Each pupil point in each one of said plurality of illumination beams has a corresponding pupil point in at least one of the other illumination beams of said plurality of illumination beams thereby defining multiple sets of corresponding pupil points, and the pupil points of each set of corresponding pupil points are spatially coherent with respect to each other.

37 Claims, 13 Drawing Sheets

(56) References Cited

U.S. PATENT DOCUMENTS

| | | |
|---|---|---|
| 9,939,742 B2 | 4/2018 | Tinnemans et al. |
| 10,585,363 B2 | 3/2020 | Mathijssen et al. |
| 2006/0033921 A1 | 2/2006 | Den Boef et al. |
| 2006/0066855 A1 | 3/2006 | Boef et al. |
| 2009/0195768 A1 | 8/2009 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2012/0206703 A1 | 8/2012 | Bhattacharyya et al. |
| 2013/0258310 A1 | 10/2013 | Smilde et al. |
| 2013/0271740 A1 | 10/2013 | Quintanilha |
| 2014/0146322 A1 | 5/2014 | Hill et al. |
| 2015/0355554 A1 | 12/2015 | Mathijssen |
| 2016/0216197 A1 | 7/2016 | Bringoltz et al. |
| 2017/0184977 A1 | 6/2017 | Jak et al. |
| 2018/0031424 A1 | 2/2018 | Hill et al. |
| 2018/0348645 A1* | 12/2018 | Ravensbergen ..... G01B 11/272 |

FOREIGN PATENT DOCUMENTS

| | | | |
|---|---|---|---|
| JP | 2016-502134 A | 1/2016 | |
| JP | 2018-517933 A | 7/2018 | |
| TW | 2014-28262 A | 7/2014 | |
| TW | 2018-05593 A | 2/2018 | |
| WO | WO 2009/078708 A1 | 6/2009 | |
| WO | WO 2009/106279 A1 | 9/2009 | |
| WO | WO 2013/178422 A1 | 12/2013 | |
| WO | WO 2015/051970 A1 | 4/2015 | |
| WO | WO-2020224882 A1 * | 11/2020 | ......... G02B 21/0016 |

OTHER PUBLICATIONS

International Preliminary Report on Patentability directed to related International Patent Application No. PCT/EP2019/072762, dated Mar. 23, 2021; 6 pages.

* cited by examiner

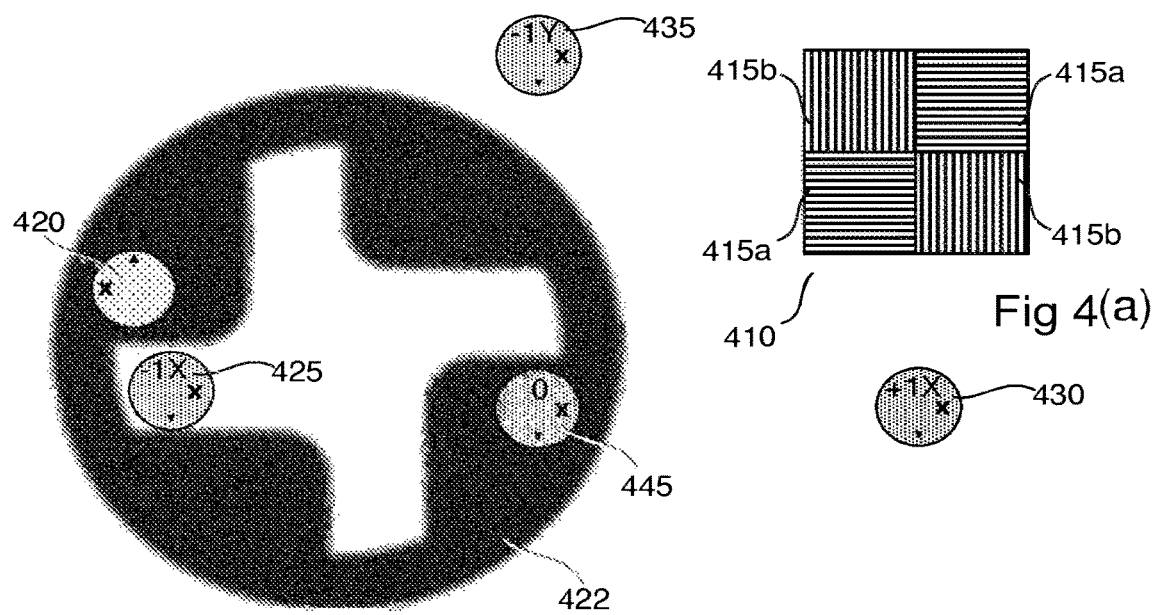
Fig 4(a)
Fig. 4(b)
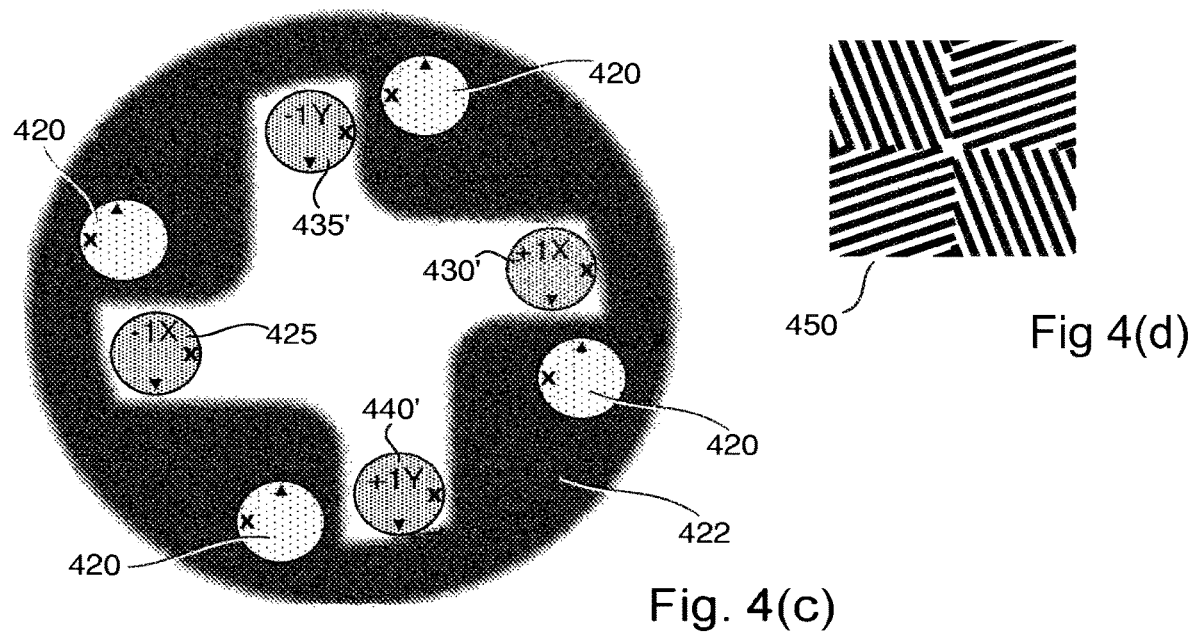
Fig. 4(c)
Fig 4(d)

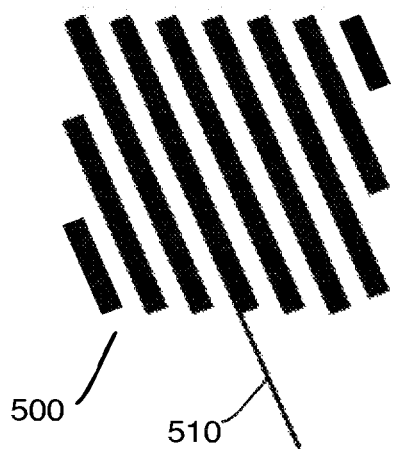
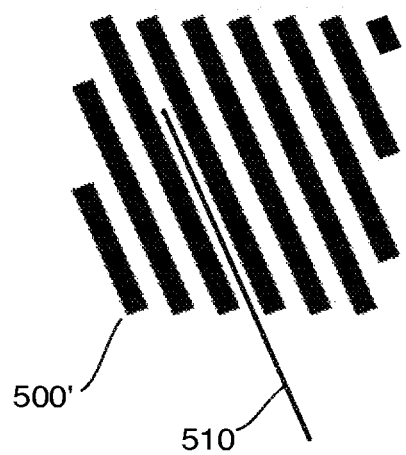
Fig. 5(a)      Fig. 5(b)
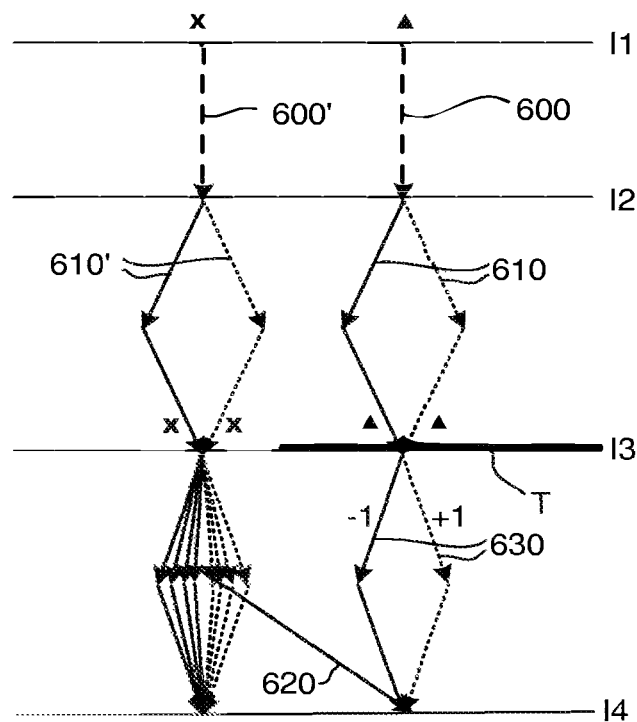
Fig. 6

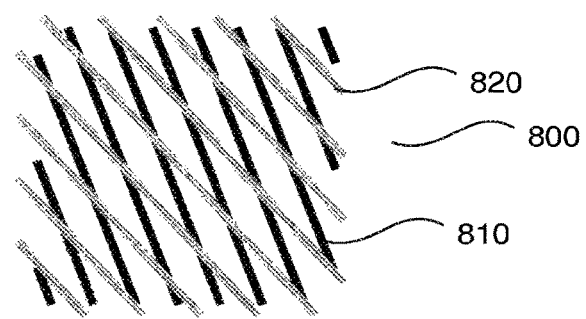
Fig. 8
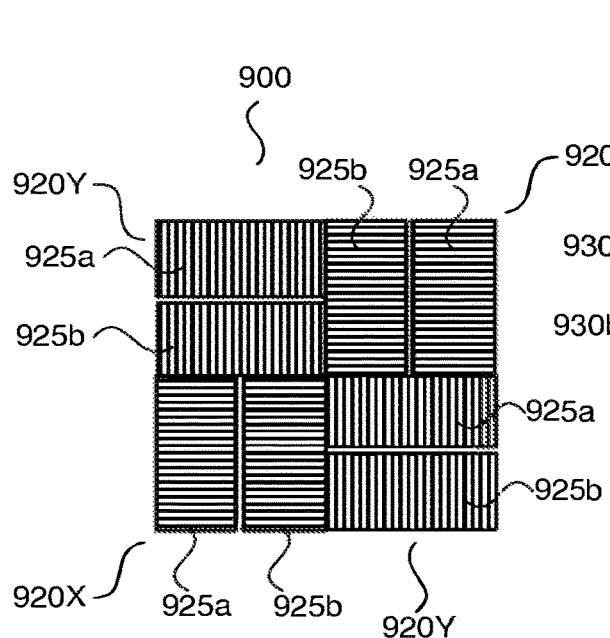 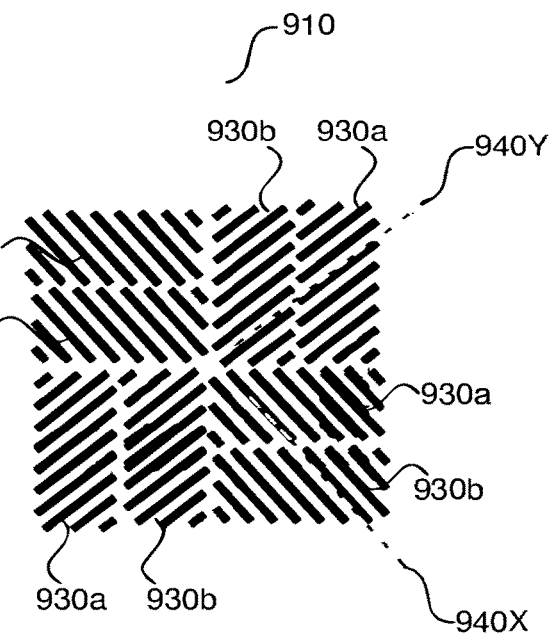
Fig. 9(a)  Fig. 9(b)

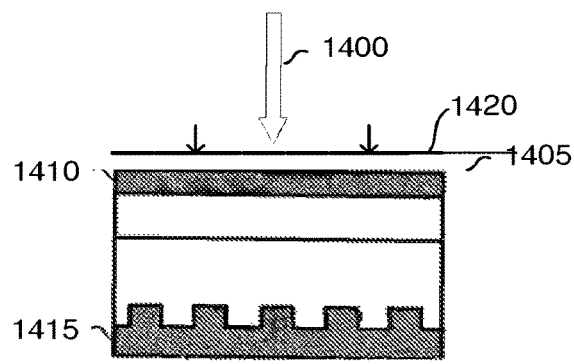
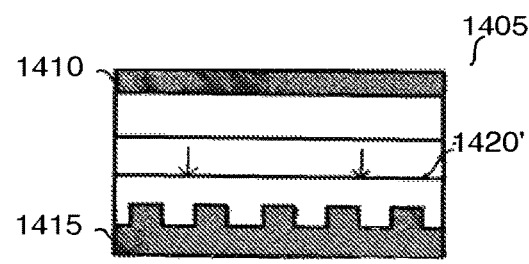
Fig. 14(a)   Fig. 14(b)
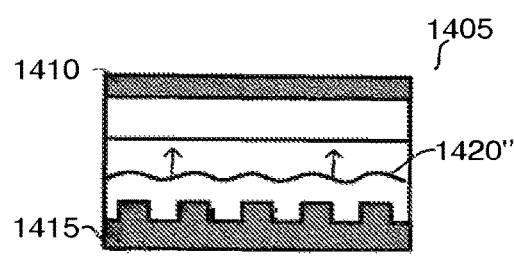
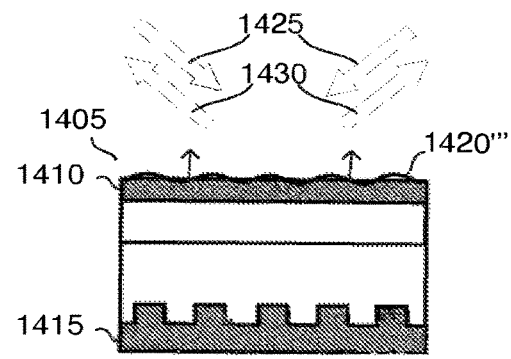
Fig. 14(c)   Fig. 14(d)
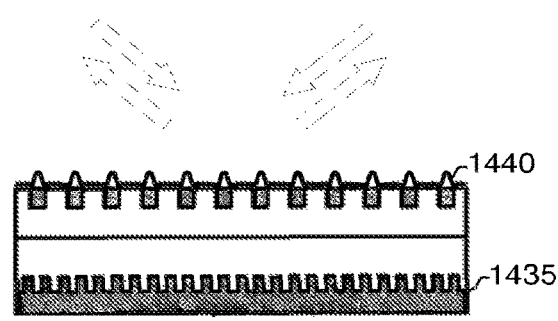
Fig. 14(e)

METROLOGY SENSOR FOR POSITION METROLOGY

CROSS-REFERENCE TO RELATED APPLICATIONS

This application claims priority of EP application 18195488.4 which was filed on Sep. 19, 2018 and EP application 19150245.9 which was filed on Jan. 3, 2019. Both EP applications are incorporated herein in their entirety by reference.

FIELD OF THE INVENTION

The present invention relates to methods and apparatus for measuring positional information in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

In order to monitor the lithographic process, parameters of the patterned substrate are measured. Parameters may include, for example, the overlay error between successive layers formed in or on the patterned substrate. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

SUMMARY OF THE INVENTION

In a first aspect of the invention, there is provided a metrology device configured to produce measurement illumination comprising a plurality of illumination beams, each of said illumination beams being spatially incoherent or pseudo-spatially incoherent and comprising multiple pupil points in an illumination pupil of the metrology device, wherein each pupil point in each one of said plurality of illumination beams has a corresponding pupil point in at least one of the other illumination beams of said plurality of illumination beams thereby defining multiple sets of corresponding pupil points, and wherein the pupil points of each set of corresponding pupil points are spatially coherent with respect to each other.

In an embodiment each pupil point is substantially spatially incoherent with respect to all other pupil points in the same illumination beam.

In an embodiment each set of pupil points is a geometric translation of all other sets of pupil points within said illumination pupil, at least for the illumination beams corresponding to a considered measurement direction.

In an embodiment the metrology device further comprises an off-axis illumination generator to generate the plurality of illumination beams of measurement illumination from a single beam of incoherent radiation. In a further embodiment the off-axis illumination generator comprises at least one phase grating for each measurement direction or a 2D phase grating. In a further embodiment the comprises at least one pair of phase gratings for each measurement direction or 2D phase grating, at least one pair of lenses and at least one pair of optical wedges in a Fourier plane defined by one lens of said at least one pair of lenses, arranged such that different wavelengths within each illumination beam have a shared incident illumination angle. In a further embodiment the off-axis illumination generator comprises at least one variable attenuator located in the path of at least one of the generated illumination beams such that the intensities of the generated illumination beams are balanced.

In an embodiment the off-axis illumination generator comprises a plurality of beam splitter and reflector components arranged to generate four identical illumination beams from said single beam of incoherent radiation, and such that different wavelengths within each illumination beam have a shared incident illumination angle.

In an embodiment each illumination beam is located in the illumination pupil, such that a corresponding higher diffraction order is captured in a detection pupil of the metrology device for each illumination beam, following scattering of said measurement illumination by a periodic structure. In a further embodiment said plurality of illumination beams comprises a pair of illumination beams per considered measurement direction, and the corresponding higher diffraction orders captured comprise complementary higher diffraction orders for each direction. In a further embodiment the pupil points of each set of corresponding pupil points are spatially coherent with respect to each other for all of said plurality of illumination beams. In another further embodiment the pupil points of each set of corresponding pupil points are spatially coherent with respect to each other for only each pair of illumination beams corresponding to a single of said considered measurement directions.

In an embodiment the metrology device is operable in a dark field configuration such that a zeroth order of scattered radiation is not detected.

In an embodiment the metrology device comprises a pupil imaging branch for imaging said detection pupil of the metrology device. In a further embodiment the metrology comprises a spot size tuner for tuning the spot size of said measurement illumination and/or the illumination beams.

In an embodiment the metrology device comprises tunable filters in the illumination pupil and/or detection pupil, said tunable filters for tuning one or more of: color, polarization, spatial distribution and angular distribution.

In an embodiment the metrology device comprises a detector operable to image an interference pattern resultant from interference of said higher diffraction orders. In a further embodiment the metrology device is operable to determine positional information from the position of said interference pattern. In a further embodiment the metrology device is operable as an alignment sensor for measuring position of a periodic structure on a substrate with respect to a fixed reference from said position of said interference pattern. In a further embodiment the metrology device is operable as an overlay metrology device operable to measure overlay from the relative positions of two interference patterns, each corresponding to a different periodic structure.

In an embodiment the metrology device is operable to: measure a plurality of periodic structures on a substrate to obtain a plurality of measurements; and optimize positioning of the substrate in a subsequent processing step based on said plurality of position measurements. In a further embodiment some or all of the periodic structures relate to different layers of a lithographic process for forming structures on the substrate. In a further embodiment the metrology device is operable such that said optimizing positioning of the substrate comprises determining a weighted average based on a determined or assigned criticality of each layer. In an embodiment the metrology device is operable to measure said plurality of periodic structures on a substrate by capturing interference patterns corresponding to each of said periodic structures in a single image.

In an embodiment the metrology device is said measurement illumination comprises multiple wavelengths or wavelength bands. In a further embodiment the metrology device is operable to obtain separate images of each interference pattern corresponding to each of said multiple wavelengths or wavelength bands, wherein said separate images are obtained sequentially on the same region of the detector; or simultaneously, each image on a different region of the detector or on different detectors.

In an embodiment the metrology device is operable to image the interference patterns corresponding to each of said multiple wavelengths or wavelength bands simultaneously on the same region of the detector, and further operable to process the image by separating the interference patterns based on a different angle of orientation of each interference pattern.

In an embodiment the metrology device is operable to determine, for each periodic structure, one or more optimized regions of interest of said interference pattern. In a further embodiment said one or more optimized regions of interest are determined based on one or more characteristics of an image of said interference pattern and/or measured or modelled performance parameter values as a function of the optimized regions of interest. In a further embodiment said one or more optimized regions of interest comprise a plurality of regions of interest, each region of interest comprising a corresponding weighting based on one or more characteristics of an image of said interference pattern and/or measured or modelled performance parameter values as a function of the optimized regions of interest.

In an embodiment said measurement illumination comprises a known State of Polarization, and said metrology device comprises a polarization separating element, said metrology device being arranged to separately image polarization resolved interference patterns.

In an embodiment the metrology device is operable in different illumination modes wherein said measurement illumination comprises only a subset of plurality of illumination beams. In a further embodiment said illumination modes include one or single beam modes wherein said subset comprises only a single one of said illumination beams. In a further embodiment the metrology device is operable to determine asymmetry in the periodic structure based on a detected intensity of scattered radiation detected using one or more of said single beam modes. In a further embodiment said detected intensity comprises a detected intensity difference between opposing higher diffraction orders obtained using two of said single beam modes, each single beam mode corresponding to one of said higher diffraction orders. In a further embodiment said determined asymmetry is used to correct a position measurement. In a further embodiment said determined asymmetry is used to determine a value for overlay or focus.

In an embodiment the metrology device is operable to determine asymmetry in the periodic structure based on a measure of the interference fringe contrast in the interference pattern.

In an embodiment the metrology device is operable to determine asymmetry in the periodic structure based on a measure of the position of the interference fringes in the interference pattern.

In an embodiment the metrology device comprises at least one detector reference periodic structure to enable calibration for drift in the detector.

In an embodiment the metrology device comprises an illumination tuning component providing a tunable wavelength and/or spectrum functionality for said measurement illumination.

In an embodiment the metrology device comprises at least one aberration reference periodic structure to enable calibration for optical aberration within the metrology device. In a further embodiment the metrology device is operable to perform an aberration calibration by: measuring the reference periodic structure, determining an aberration fingerprint describing the optical aberration within the metrology device from the measurement of the reference periodic structure, and using said aberration fingerprint to correct subsequent measurements.

In an embodiment the metrology device comprises a tunable polarizer for tuning the polarization of the measurement illumination and a corresponding polarization detector in a detection path of the metrology device.

In an embodiment the metrology device comprises a pupil illumination mode component operable to vary coherence between said illumination beams.

In an embodiment the metrology device comprises a spatially incoherent radiation source for generating the measurement radiation. In a further embodiment said spatially incoherent radiation source comprises an incandescent source, a light emitting diode source or a laser produced plasma source.

In an embodiment the metrology device comprises a pseudo-spatially incoherent radiation source which produces radiation which mimics spatially incoherent radiation. In a further embodiment the pseudo-spatially incoherent radiation source comprises a laser source and a multimode generator for creating multimode radiation, said pseudo-spatially incoherent radiation source being operable to ensemble average different realizations of the multimode radiation so as to mimic spatially incoherent radiation. In a further embodiment the multimode generator comprises a rotating diffusor to create speckle patterns. In another embodiment the multimode generator comprises a goniometer for scanning a single mode laser beam from the laser over different angles.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIGS. 4(a)-4(d) show 4(a) an example target usable in alignment, 4(b) a pupil image of the detection pupil corresponding to detection of a single order, 4(c) a pupil image of the detection pupil corresponding to detection of four diffraction orders, and 4(d) a schematic example of an imaged interference pattern following measurement of the target of FIG. 4(a);

FIG. 5(a) show schematically during an alignment measurement, an imaged interference pattern corresponding to 5(a) a first substrate position and 5(b) a second substrate position;

FIG. 6 illustrates schematically the propagation of radiation through the metrology system of FIG. 2;

FIG. 8 shows schematically, an imaged interference pattern corresponding to two wavelengths imaged simultaneously on the same camera, according to an embodiment;

FIGS. 9(a)-9(b) show 9(a) an example target usable in overlay and 9(b) a schematic example of an imaged interference pattern following measurement of the target of FIG. 9(a), according to an embodiment for measuring overlay;

FIGS. 10(a) and 10(c) show pupil images of first and second illumination modes respectively;

FIGS. 10(b) and 10(d) schematic illustrations of the image captures resulting from the first and second illumination modes respectively; FIGS. 10(e) and 10(f) show interference fringe pattern resultant from measuring a target with, respectively, zero asymmetry and with non-zero asymmetry; and FIGS. 10(f) and 10(g) illustrate simultaneous detection of multiple diffraction orders;

FIGS. 14(a)-14(e) schematically illustrate various pump-probe illumination methods;

DETAILED DESCRIPTION

Before describing embodiments of the invention in detail, it is instructive to present an example environment in which embodiments of the present invention may be implemented.

Figure 1:
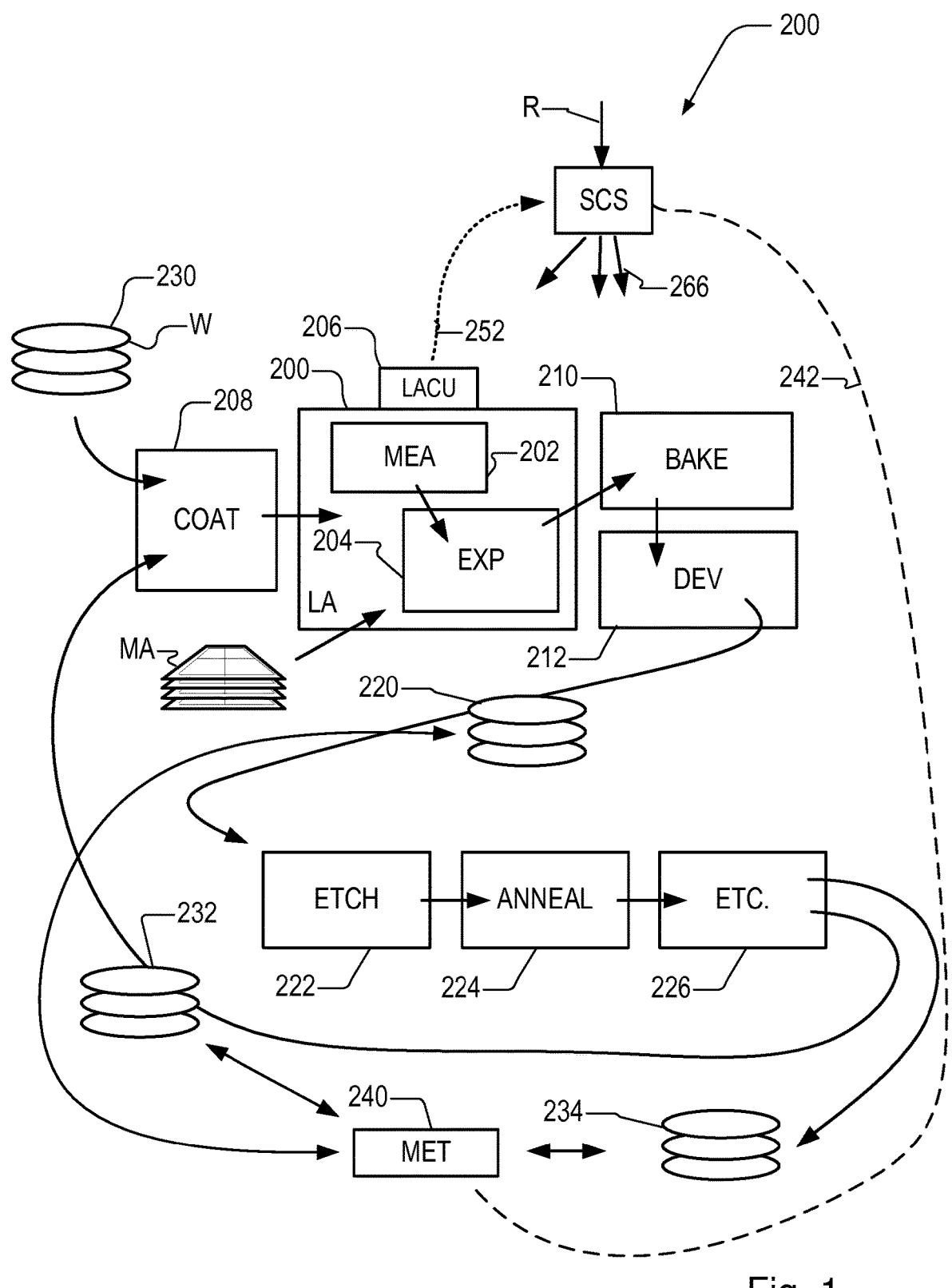
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged. In an alternative embodiment the measurement station is part of a separate metrology or alignment apparatus. In another embodiment the substrates are exchanged between the measurement station and the exposure station wherein each station comprises a separate substrate table to hold a substrate and the substrate is unloaded from the measurement substrate table, after the measurements on the substrate are performed, and then transferred to and loaded on the substrate table of the exposure station for the exposure process.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for performing measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

In performing alignment by measuring the position of alignment marks on the substrate using an alignment sensor, it would be desirable to reduce the size of the alignment mark pitches, for example to within the order of magnitude of 100 nm (more specifically within the range of 300-800 nm). It would also be desirable to reduce the area (footprint) of the alignment marks, so that many (e.g., thousands) of them could be accommodated all over the wafer; including in-die, between product structures, where wafer space is "expensive".

Many present alignment sensors, such as those described in the publications mentioned in the introduction, require conjugate off-axis beams which are mutually coherent (e.g., they originate from the same single-mode radiation source). This allows for interference between corresponding diffracted orders. However, the use of spatially coherent radiation results in interference artifacts such as speckle effects, which have an impact on the alignment measurement, resulting in positional errors. Other present alignment sensors use spatially incoherent radiation, thereby obviating the speckle problem. However, when using incoherent radiation, the only way it becomes possible to resolve small mark pitches (e.g., smaller than the illumination wavelength) is by imaging in a bright-field mode, in which a higher diffraction order is interfered with the zeroth order. By comparison, the aforementioned coherent source sensors can use a dark-field imaging mode, where the zeroth order is typically blocked. Such dark-field imaging provides superior performance to bright-field imaging.

To address the issues above, a metrology device with optimized coherence is proposed. More specifically, proposed herein is a metrology device configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device will be able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Proposed Hardware Example

Figure 2:
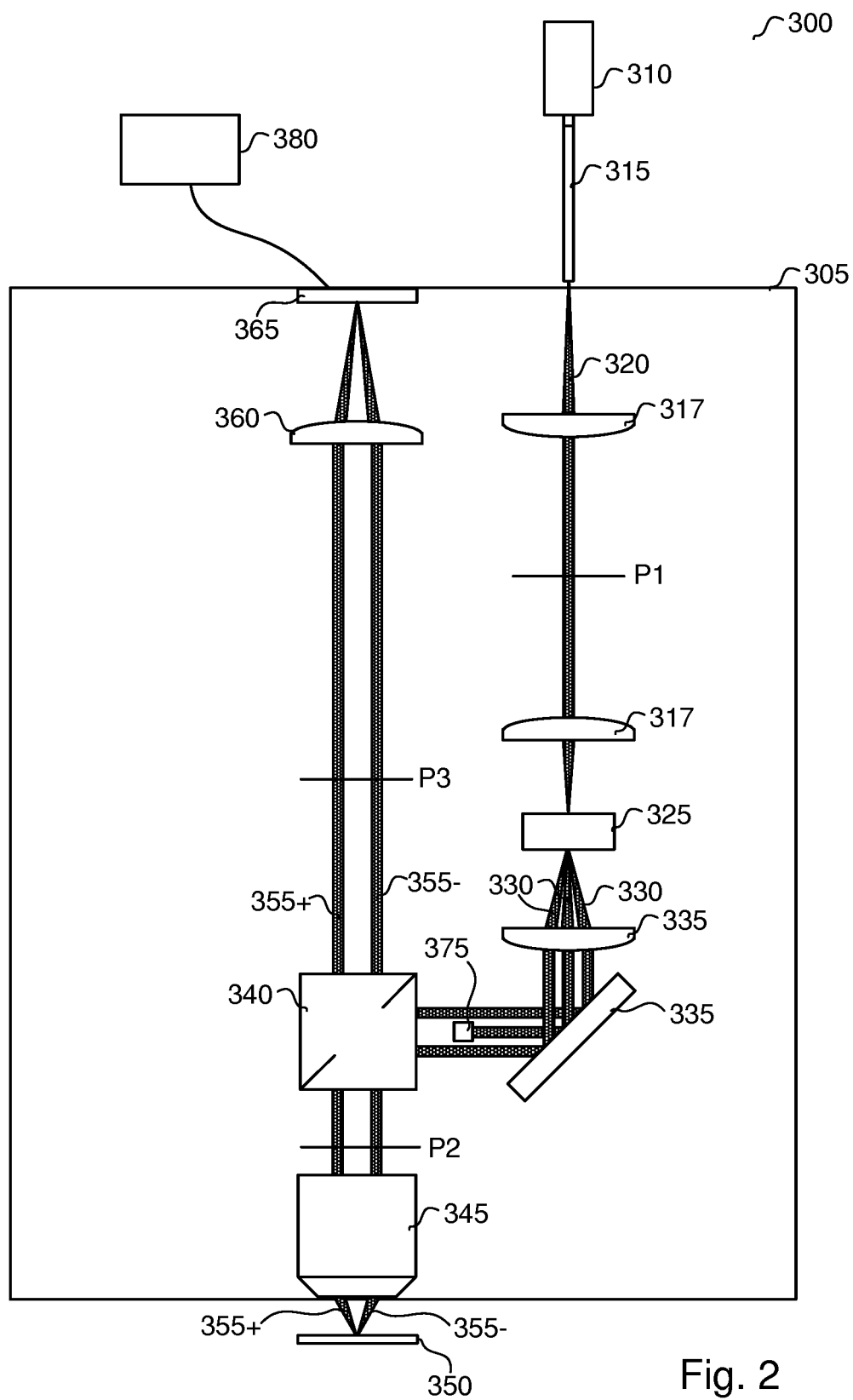
FIG. 2 is a schematic illustration of a metrology device according to a first embodiment of the invention.

FIG. 2 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. This component is of particular importance to the concepts herein and will be described in greater detail. The coherent off-axis illumination generator 325 generates a plurality (e.g., four) off-axis beams 330 from the spatially incoherent radiation beam 320. The characteristics of these off-axis beams 330 will be described in detail further below. The zeroth order of the illumination generator may be blocked by an illumination zero order block element 375. This zeroth order will only be present for some of the coherent off-axis illumination generator examples described in this document (e.g., phase grating based illumination generators), and therefore may be omitted when such zeroth order illumination is not generated. The off-axis beams 330 are delivered (via optical components 335 and) a spot mirror 340 to an (e.g., high NA) objective lens 345. The objective lens focusses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by camera 365.

The zeroth order diffracted (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e. in the current embodiment there are four of these zeroth order reflections in total. An example aperture profile suitable for blocking the four zeroth order reflections is shown in FIGS. 4(*b*) and (*c*), labelled 422. As such, the metrology device operated as a "dark field" metrology device.

A main concept of the proposed metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 330 is spatially incoherent.

Figure 3A:
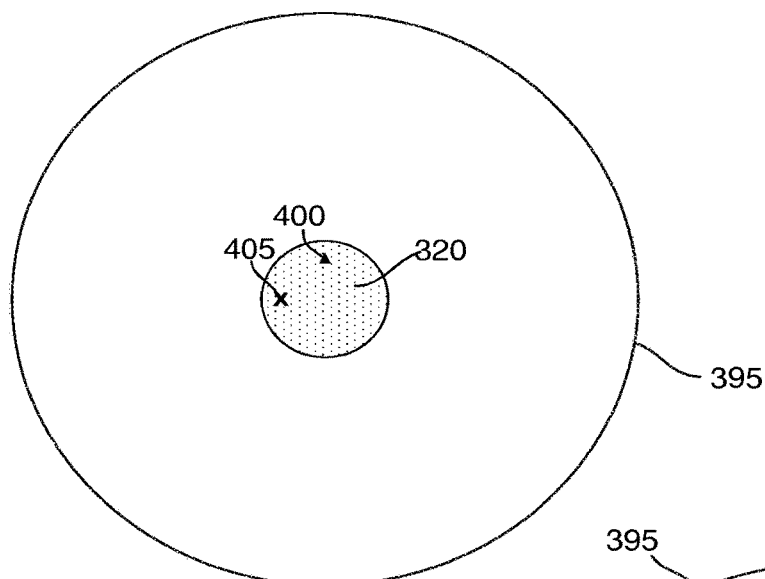
FIGS. 3(a)-3(c) comprise 3(a) a pupil image of input radiation 3(b) pupil image of off-axis illumination beams illustrating an operational principle of the metrology device of FIG. 2 according to a first embodiment; and 3(c) pupil image of off-axis illumination beams illustrating an operational principle of the metrology device of FIG. 2 according to a second embodiment.
Figure 3B:
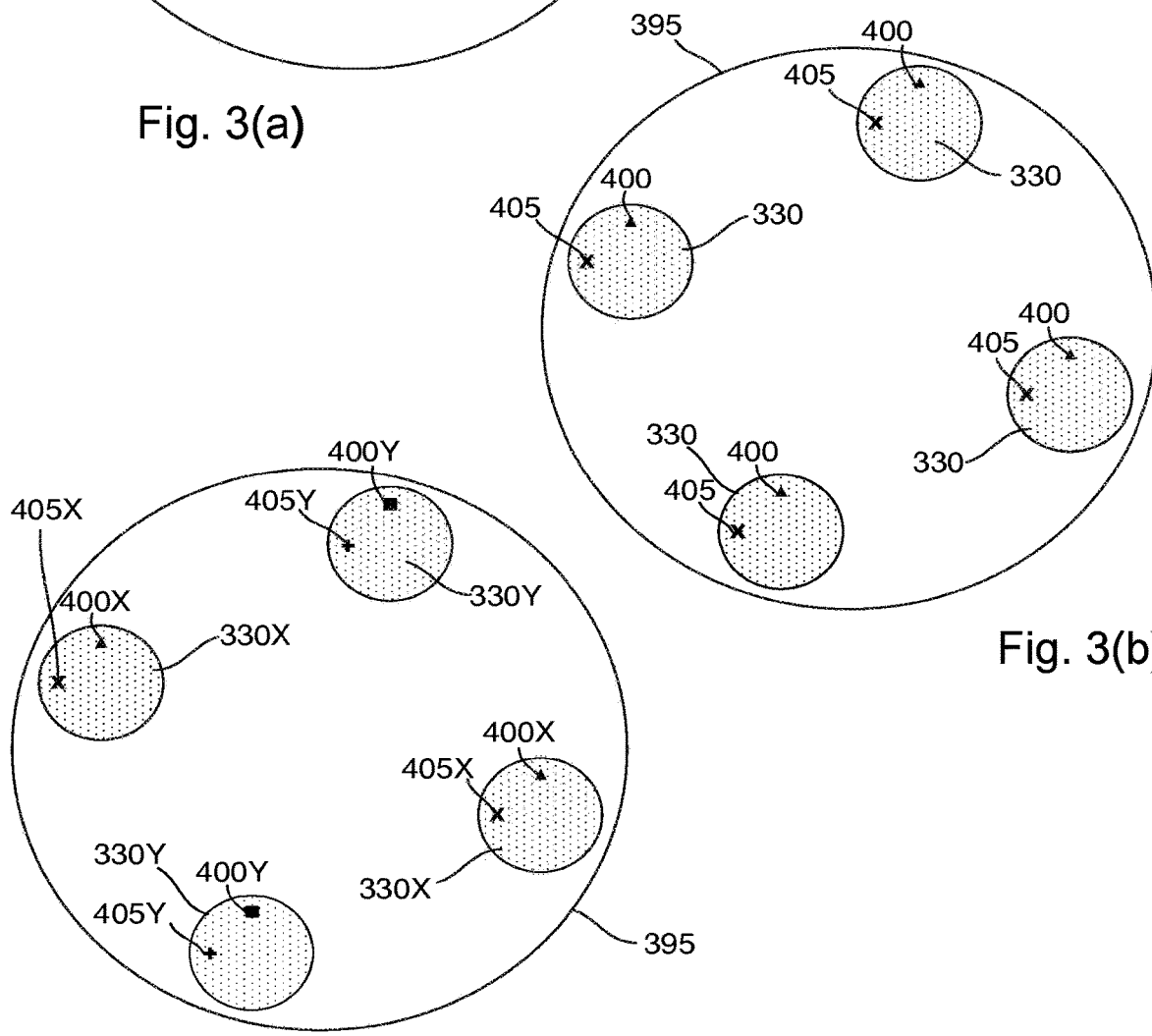

FIG. 3 shows three pupil images to illustrate the concept. FIG. 3(*a*) shows a first pupil image which relates to pupil plane P1 in FIG. 2, and FIGS. 3(*b*) and 3(*c*) each show a second pupil image which relates to pupil plane P2 in FIG. 2. FIG. 3(*a*) shows (in cross-section) the spatially incoherent radiation beam 320, and FIGS. 3(*b*) and 3(*c*) show (in cross-section) the off-axis beams 330 generated by coherent off-axis illumination generator 325 in two different embodiments. In each case, the extent of the outer circle 395 corresponds to the maximum detection NA of the microscope objective; this may be, purely by way of an example 0.95 NA.

The triangles 400 in each of the pupils indicate a set of pupil points that are spatially coherent with respect to each other. Similarly, the crosses 405 indicate another set of pupil points which are spatially coherent with respect to each other. The triangles are spatially incoherent with respect to crosses and all other pupil points corresponding to beam propagation. The general principle (in the example shown in FIG. 3(*b*)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 3(*b*), the spacing between each pupil point of the first coherent set of points represented by triangles 400 must be equal to the spacing between each pupil point of the coherent set of points represented by crosses 405. 'Spacing' in this context is directional, i.e., the set of crosses (second set of points) is not allowed to be rotated with respect to the set of triangles (first set of points). As such, each of the off-axis beams 330 comprises by itself incoherent radiation; however the off-axis beams 330 together comprise identical beams having corresponding sets of points within their cross-section that have a known phase relationship (spatial coherence). It should be noted that it is not necessary for the points of each set of points to be equally spaced (e.g., the spacing between the four triangles 405 in this example is not required to be equal). As such, the off-axis beams 330 do not have to be arranged symmetrically within the pupil.

Figure 3C:
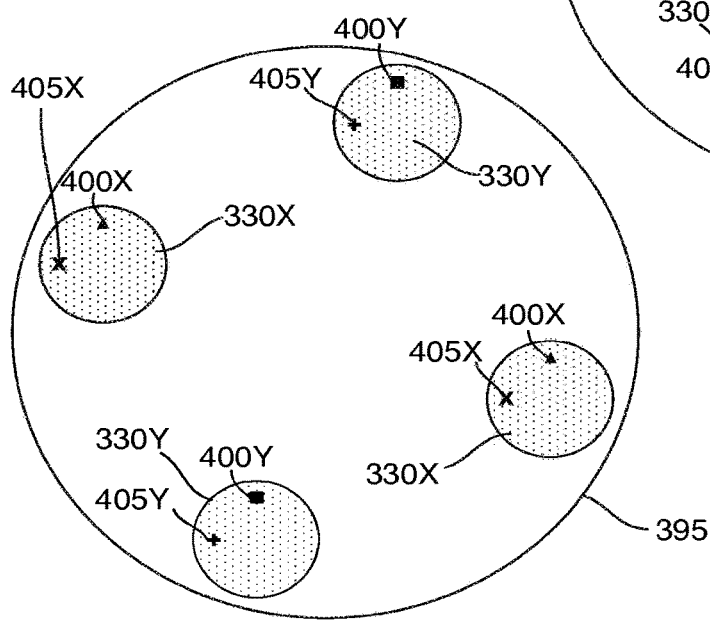

FIG. 3(*c*) shows that this basic concept can be extended to providing for a mutual spatial coherence between only the beams corresponding to a single measurement direction where beams 330X correspond to a first direction (X-direction) and beams 330Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 3(c), the off-axis beams are only pair-wise coherent.

In this embodiment, the off-axis beams are considered separately by direction, e.g., X direction 330X and Y direction 330Y. The pair of beams 330X which generate the captured X direction diffraction orders need only be coherent with one another (such that pair of points 400X are mutually coherent, as are pair of points 405X). Similarly the pair of beams 330Y which generate the captured Y direction diffraction orders need only be coherent with one another (such that pair of points 400Y are mutually coherent, as are pair of points 405Y). However, there does not need to be coherence between the pairs of points 400X and 400Y, nor between the pairs of points 405X and 405Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

In the above description, the beams are all spatially incoherent. Spatially incoherent radiation may be obtained using light emitting diodes, light bulbs, a laser pumped plasma source or any other suitable incoherent source. In other embodiments, the beams may be pseudo-spatially incoherent, e.g., generated from a coherent illumination source such as a laser, while undergoing one or more processes to mimic spatial incoherence. This may comprise making the coherent radiation multimode and ensemble averaging different realizations during the integration time of the detector. More specifically, in an embodiment, many (e.g., random) realizations of speckle patterns (which are spatially coherent patterns) are generated with, e.g., a rotating diffuser plate and a laser. An ensemble average over these random speckle pattern realizations is determined which averages out interference effects and therefore effectively mimics spatial incoherence (the interference is averaged out on the detector plane during its integration time). An alternative pseudo-spatially incoherence approach scans a single mode laser beam that over different angles (which are modes); e.g., using a goniometer.

Working Principle for Alignment/Position sensing

FIG. 4 illustrates the working principle of the metrology system. FIG. 4(a) illustrates a target 410 which can be used as an alignment mark in some embodiments. The target 410 may be similar to those used in micro diffraction based overlay techniques (μDBO), although typically comprised only in a single layer when forming an alignment mark. As such, the target 410 comprises four sub-targets, comprising two gratings (periodic structures) 415a in a first direction (X-direction) and two gratings 415b in a second, perpendicular, direction (Y-direction). The pitch of the gratings may comprise an order of magnitude of 100 nm (more specifically within the range of 300-800 nm), for example.

FIG. 4(b) shows a pupil representation corresponding to (with reference to FIG. 2) pupil plane P3. The Figure shows the resulting radiation following scattering of only a single one of the off-axis illumination beams, more specifically (the left-most in this representation) off-axis illumination beam 420 (which will not be in this pupil, its location in pupil plane P2 corresponds to its location in the illumination pupil and is shown here only for illustration). The shaded region 422 corresponds to the blocking (i.e., reflecting or absorbing) region of a specific spot mirror design (white represents the transmitting region) used in an embodiment. Such a spot mirror design is purely an example of a pupil block which ensures that undesired light (e.g. zeroth orders and light surrounding the zeroth orders) are not detected. Other spot mirror profiles (or zero order blocks generally) can be used.

As can be seen, only one of the higher diffraction orders is captured, more specifically the −1 X direction diffraction order 425. The +1 X direction diffraction order 430, the −1 Y direction diffraction order 435 and the +1 Y direction diffraction order 440 fall outside of the pupil (detection NA represented by the extent of spot mirror 422) and are not captured. Any higher orders (not illustrated) also fall outside the detection NA. The zeroth order 445 is shown for illustration, but will actually be blocked by the spot mirror or zero order block 422.

FIG. 4(c) shows the resultant pupil (captured orders only) resultant from all four off-axis beams 420 (again shown purely for illustration). The captured orders include the −1 X direction diffraction order 425, a +1 X direction diffraction order 430', a −1 Y direction diffraction order 435' and a +1 Y direction diffraction order 440'. These diffraction orders are imaged on the camera where they interfere forming a fringe pattern 450, such as shown in FIG. 4(d). In the example shown, the fringe pattern is diagonal as the diffracted orders are diagonally arranged in the pupil, although other arrangements are possible with a resulting different fringe pattern orientation.

In a manner similar to other metrology devices usable for alignment sensing, a shift in the target grating position causes a phase shift between the +1 and −1 diffracted orders per direction. Since the diffraction orders interfere on the camera, a phase shift between the diffracted orders results in a corresponding shift of the interference fringes on the camera. Therefore, it is possible to determine the alignment position from the position of the interference fringes on the camera.

FIG. 5 illustrates how the alignment position can be determined from the interference fringes. FIG. 5(a) shows one set of interference fringes 500 (i.e., corresponding to one quadrant of the fringe pattern 450), when the target is at a first position and FIG. 5(b) the set of interference fringes 500' when the target is at a second position. A fixed reference line 510 (i.e., in the same position for both images) is shown to highlight the movement of the fringe pattern between the two positions. Alignment, can be determined by comparing a position determined from the pattern to a position obtained from measurement of a fixed reference (e.g., transmission image sensor (TIS) fiducial) in a known manner. A single fringe pattern (e.g., from a single grating alignment mark), or single pattern per direction (e.g., from a two grating alignment mark), can be used for alignment. Another option for performing alignment in two directions may use an alignment mark having a single 2D periodic pattern. Also, non-periodic patterns could be measured with the metrology device described herein. Another alignment mark option may comprise a four grating target design, such as illustrated in FIG. 4(a), which is similar to that commonly used for measuring overlay, at present. As such, targets such as these are typically already present on wafers, and therefore similar sampling could be used for alignment and overlay. Such alignment methods are known and will not be described further.

FIG. 6 illustrates how the proposed metrology device minimizes speckle artifacts. This is best understood by considering the image planes I1, I2, I3, I4 comprising respectively: the image plane I1 at the output of the multi-mode fiber 315, the image plane I2 at the off-axis illumination generator 325, the substrate 350 image plane I3 and the camera 365 image plane I4. Each point in each of the image planes can be considered independently. Considering first the point indicated by the triangle at the multi-mode fiber output I1 (which comprises spatially incoherent illumination 600, 600'). This point is imaged onto the off-axis illumination generator at image plane I2. The point is then imaged onto a target T on the substrate as two off-axis beams 610, 610' (per direction) which have a fixed phase relation with respect to each other (determined by the off-axis illumination generator). The incident off-axis beams 610, 610' are actually cones with an angular extent which is determined by the extent of the beams in the pupil plane. The target T at the substrate plane I3 diffracts the incident off-axis beams 610 relating to the point indicated by the triangle, and applies a phase difference between which that carries the position information. By comparison, the position indicated by the cross corresponds to a non-target location at the substrate plane I3 (i.e., just adjacent the edge of target T). Imperfections (e.g. edges of the optics or imperfections in the optics) in this region can result in scattering of radiation 610' to other positions at the camera plane I4, here indicated by scattered radiation 620 to a location corresponding to that indicated by the triangle. For each position corresponding to target T, the +1 and −1 diffraction orders 630 interfere on the camera I4, translating the local position information on the substrate to a local intensity on the camera. In this interpretation, the advantage of using substantially spatially incoherent illumination is apparent. If spatially coherent illumination were used, then the radiation 620 scattered by imperfections (even if only a very small amount) could be scattered to a different location at the camera plane, whereupon it will interfere with the radiation at that location, causing speckle (and consequent alignment errors). By contrast, most of the illumination used in the proposed metrology device is incoherent, and therefore any scattered light 620, scattered to an undesired location on the camera, will not cause speckle. As such, the spatial incoherence of each illumination beam increases the accuracy and robustness of this sensor (compared to fully coherent sensors).

The Off-Axis Illumination Generator

The illumination beams and, in particular, their coherence properties are an important aspect of the proposed metrology device. Desired properties of the illumination generator would include:

All wavelengths (500-900 nm) having the same illumination angles and therefore the same locations in the illumination pupil (to optimize the small pitch capability, while avoiding switching/moving optical elements);

Low difficulty in matching path lengths (to ensure coherence between sets of pupil points);

No negative effect on the polarization of the illumination.

The off-axis illumination generator of any of the devices described herein (e.g., off-axis illumination generator 325 in FIG. 2) may be implemented in a number of ways. In its simplest embodiment, the off-axis illumination generator may comprise a phase grating (e.g., a 2D phase grating). Phase grating diffraction efficiency can be 80%, i.e. 40% in 1st order and 40% in −1st order. This efficiency will reduce when going away from the optimal wavelength, probably to about 20%. The system's overall light efficiency would probably be in the order of 5-20%.

The advantage of using a single phase grating is that it enables the system to use broadband illumination (turning on, for example, a 100 nm bandwidth at the same time) without smearing out the captured image. This is because the effect that described in FIG. 8 (see below) would not occur when using only a single phase grating. Disadvantages, assuming that a fixed illumination grating and a fixed pupil stop are used, include: the illumination angle of the shorter wavelengths becomes relatively small, making it harder to resolve small pitches, and the pupil stop must be significantly larger in order to block the zeroth orders for the whole wavelength range. A large pupil stop limits the pitch flexibility (should a desired first diffraction order be in that part of the pupil, it would also be blocked).

FIG. 7($a$) shows an improved grating-based off-axis illumination generator 737 which does not disperse different wavelengths to different illumination angles. A first grating 740 (typically a phase grating) is illuminated by illumination 745. This grating is in the pupil plane, i.e. the grating will be imaged onto the back focal plane of the microscope objective. The grating diffracts the illumination 745 into +1 diffraction order, and −1 diffraction order (0th order and higher orders are not relevant here, they may be physically blocked in the system with extra beam stops or just ignored). For simplicity, the illumination is drawn as a single ray; in reality, the (incoherent) illumination comprises a range of angles and positions, which could be shown as a range of rays (with different angles and positions). Different wavelengths are diffracted at different angles; for simplicity, only two wavelengths are shown λ1 and λ2. As such, the grating diffracts the radiation into +1 diffraction order for the first wavelength $750_{+\lambda 1}$, +1 diffraction order for the second wavelength $750_{+\lambda 2}$, −1 diffraction order for the first wavelength $750_{-\lambda 1}$ and −1 diffraction order for the first wavelength $750_{-\lambda 2}$. A first optical component (e.g., lens) 755 effectively Fourier transforms the diffracted illumination $750_{+\lambda 1}$, $750_{+\lambda 2}$, $750_{-\lambda 1}$, $750_{-\lambda 2}$. Wedges 760$a$, 760$b$ are placed in the Fourier plane. One wedge 760$a$ tilts the +1 diffraction order $750_{+\lambda 1}$, $750_{+\lambda 2}$ in a first direction. The other wedge 760$b$ tilts the −1 diffraction order $750_{-\lambda 1}$, $750_{-\lambda 2}$ in a second (e.g., symmetric around the optical axis O) direction. Since the wedges 760$a$, 760$b$ are in the Fourier plane of the objective pupil (back focal plane), the tilt induced by the wedges 760$a$, 760$b$ determines the position of the beams in the pupil plane (due to the Fourier relation). A second optical component (e.g., lens) 765 transforms the beams back to the pupil plane. The beams are now separated spatially. A second grating 770 (e.g., phase grating) is placed in this plane to diffract the orders back to the zeroth order. This ensures that the same diffraction orders of different wavelengths (e.g., $750_{+\lambda 1}$, and $750_{+\lambda 2}$; $750_{-\lambda 1}$ and $750_{-\lambda 2}$) overlap not only spatially, but also have identical incident angles. Should lenses 755, 765 have equal focal length, the first and second gratings 740, 770 should have equal pitches. Finally, two more lenses 775 and a spatial filter 780 may be provided to remove leakage light in higher orders (which is not diffracted to the zeroth order).

The off-axis illumination generator of FIG. 7($a$) is described for two illumination beams. A straightforward way to generalize to four beams would be to use 2D gratings and a 4-fold wedge. Optionally, a few millimeters of glass could be added to the wedge-segments that correspond to e.g. the left-most and right-most beam in the pupil, to induce a path length difference with respect to the top-most and bottom-most beams. In this case, the beams would be pair-wise coherent. This may be preferred over having all four beams coherent in some embodiments.

FIGS. 7($b$) (top view) and ($c$) (side view) illustrates an alternative embodiment of off-axis illumination generator 700, which uses a combination of beam splitter 705 and reflector 710 components to generate four off-axis beams 715 from input beam 720.

Figure 7A:
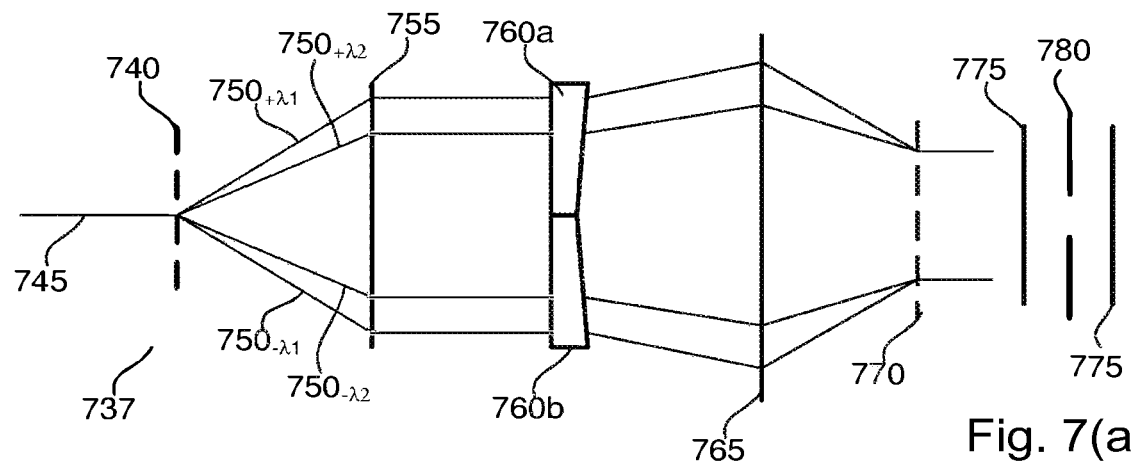
FIGS. 7(a)-7(d) schematic illustrations of 7(a) a first embodiment of an off-axis illumination generator; a second embodiment of an off-axis illumination generator in 7(b) top view and 7(c) side view; and 7(d) a third embodiment of an off-axis illumination generator.
Figure 7B:
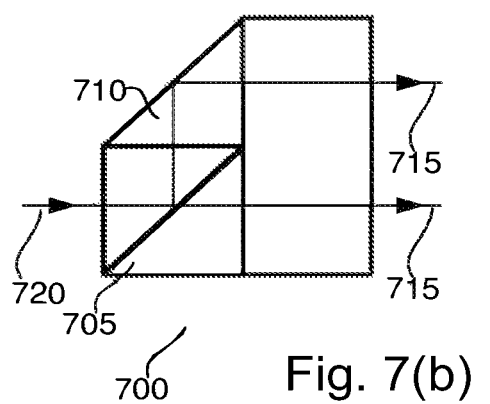
Figure 7C:
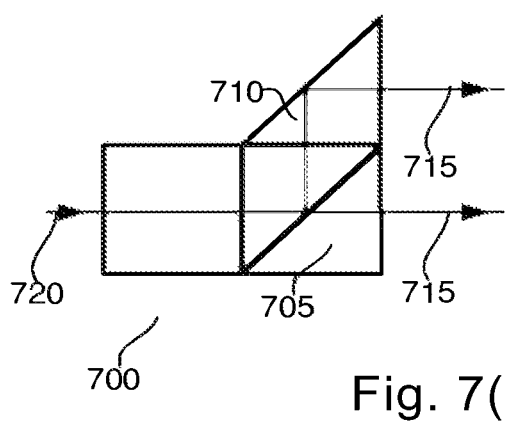
Figure 7D:
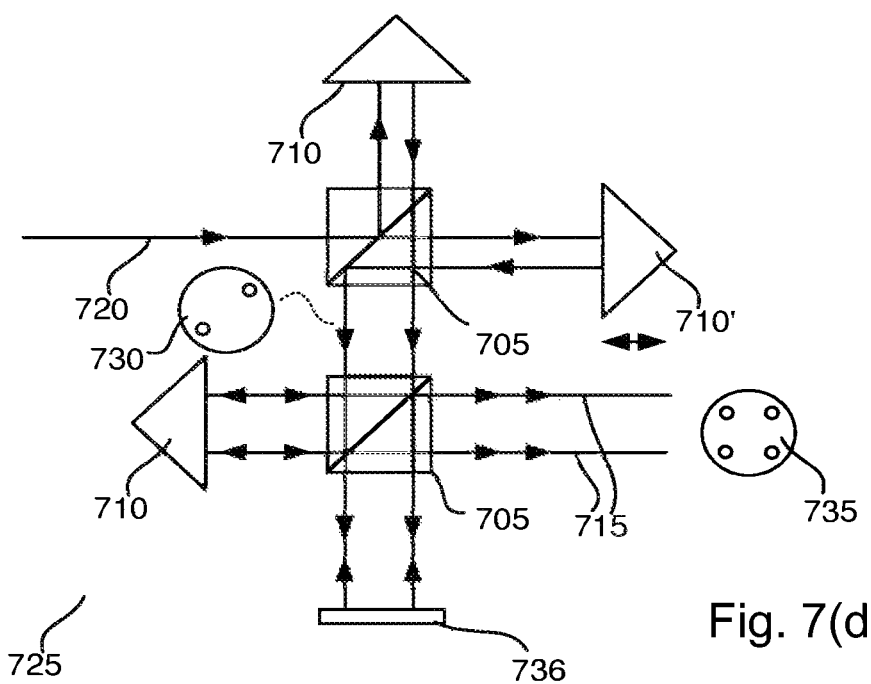

FIG. 7(d) shows a similar arrangement off-axis illumination generator 725, but one which allows for adjustment of the beam positions within the pupil by adjustment of the position of retro-reflector 710'. The pupils at an intermediate stage 730 and at the output 735 are shown for illustration. The position of retro reflector 710' in the x-direction is tuned such that the pathlengths of the two beams in pupil 730 are matched, to ensure that they are (pair-wise) coherent. The positions of retro-reflectors 710, 710' can also be tuned perpendicular to the direction of the incident beam to tune the positions of the two beams in pupil 730.

In pupil 730, the two beams are point-wise coherent. The bottom half of the configuration (in particular the bottom reflector 710) will make a flipped copy to obtain the top left and bottom-right beams shown in pupil 735. As such, these top-left and bottom-right beams will also be point-wise coherent. However, the paths passing by the bottom prism 710 and bottom mirror 736 are typically not matched, so that only the "diagonally opposite" beams are coherent and the others are incoherent. As such, off-axis illumination generator 725 is suited for providing pair-wise coherent illumination beams.

The retro reflectors 710, 710' could in principle be 'cube corners' which contain reflections under various angles, or right-angle prisms placed (e.g., oriented at a 45 degree angle with respect to the plane of the drawing to ensure that the two beams are on the diagonal of the pupil 730). Optional half-wave plates may be placed between the beam splitter and prisms 710 and 710', and an optional polarizer may be placed before the beam splitter (e.g., at location 720), in order to ensure that the polarization is well-defined and that there is purely 's' or purely 'p' polarization at all reflecting surfaces (to prevent polarization mixing).

Note that the optical pathlengths of beams which are intended to be mutually coherent need to be matched to within a coherence length. This is likely to require additional elements, e.g., additional glass, or possibly a delay stage, in some of the beams.

The embodiments of FIG. 7(b)-7(d) share the advantage of that shown in FIG. 7(a), that all wavelengths will have the same illumination angle.

A further alternative implementation for the off-axis illumination generator may use a beam shaping component such as a spatial light modulator (SLM). However, such an arrangement may be incompatible with the spot mirror and therefore the spot mirror would need replacing by, for example, a beam splitter and controllable pupil filter. Such an arrangement may be better suited for metrology applications other than alignment.

Multiple Wavelength Measurements

It is desirable to be able to measure multiple wavelengths (and possibly higher diffraction orders) in order to be more process robust (facilitate measurement diversity). This would enable, for example, use of techniques such as optimal color weighing (OCW), to become robust to grating asymmetry. In particular, any target asymmetry results in a different aligned position per wavelength. Thereby, by measuring this difference in aligned position for different wavelengths, it is possible to determine asymmetry in the target. In one embodiment, measurements corresponding to multiple wavelengths could be imaged sequentially on the same camera, to obtain a sequence of individual images, each corresponding to a different wavelength. Alternatively, each of these wavelengths could be imaged in parallel on separate cameras (or separate regions of the same camera), with the wavelengths being separated using suitable optical components such as dichroic mirrors.

In another embodiment, it is possible to measure multiple wavelengths (and diffraction orders) in a single camera image. When illumination beams corresponding to different wavelengths are at the same location in the pupil, the corresponding fringes on the camera image will have different orientations for the different wavelengths. This will tend to be the case for most off-axis illumination generator arrangements (an exception is a single grating, for which the wavelength dependence of the illumination grating and target grating tend to cancel each other).

FIG. 8 shows an example of such an image 800, showing a first diffraction pattern 810 (black lines) and a second diffraction pattern 820 (grey lines), each corresponding to a different wavelength. The period and angle of the observed fringe pattern is directly related to the illumination wavelength. By appropriate processing of such an image, alignment positions can be determined for multiple wavelengths (and orders) in a single capture. These multiple positions can e.g. be used as an input for OCW-like algorithms.

Other Metrology Applications—Phase Based

The metrology device has application beyond alignment sensing. For example, the metrology device is suited for measuring overlay (relative alignment between layer pairs). In a first embodiment, an image based overlay technique is described. Image-based overlay is very similar to alignment. The key difference is that for alignment the phase is compared against a fixed reference, e.g., a TIS plate, to establish an absolute position measurement. For image-based overlay, conditions are more relaxed and the reference is formed by a second grating which is captured in the same snapshot/measurement region. The relative displacement between the two gratings can be used to determine overlay. This measurement can be performed without the need of benchmarking with a fixed reference. For an image-based overlay sensor that works with a camera, it is preferable if both gratings are captured simultaneously within a single image. However, this is not necessary and two images could, for example, be stitched together.

FIG. 9 shows (a) a proposed overlay target 900 for image based overlay metrology and (b) a resultant image capture 910 following measurement of target 900. As is conventional, the target 900 comprises quadrants 920X for measurement of overlay in the X direction and quadrants 920Y for measurement of overlay in the Y direction. Each quadrant 920X, 920Y comprises two gratings 925a, 925b. These two gratings 925a, 925b will typically be in different layers, although stitching type marks for measuring relative alignment of two parts of a stitched die may have both gratings within a single layer. Overlay will manifest itself as an offset between the interference pattern 930a corresponding to gratings 925a and the interference pattern 930b corresponding to grating 925b (a reference line 940X, 940Y is shown to illustrate this offset in the two directions).

The design of the metrology device is optimized for gratings with small pitches. However, it is possible to use the device to measure targets with larger pitches (e.g., greater than 1 µm), e.g., to maintain compatibility with such targets as may presently be used. An issue with such large pitches is that diffraction orders higher than the +1,−1 orders will be captured, notably the +3 and −3 diffraction orders; these will interfere with the +1 and −1 orders respectively complicating the intensity pattern and the interpretation thereof. However, the image can be resolved using Fourier analysis and filtering techniques. Alternatively, spatial filters, suitably located in the illumination pupil and detection pupil, may be used to block the undesired higher orders from reaching the camera. Such filters should be optimized per target so not to block diffraction from other (desired) pitches.

Another approach for maintaining backward compatibility with another type of presently used target is proposed, thereby enabling measurement of overlay on regular µDBO targets using the proposed metrology sensor. Such µDBO-based overlay targets typically comprise two gratings, one overlaying the other, thereby creating an 'asymmetric grating', with the degree of asymmetry being dependent on the overlay (offset between the two gratings). Measurement of the target (using a current method) comprises detecting an intensity imbalance between the positive and negative diffracted orders which is dependent on the target asymmetry and therefore overlay.

The proposed approach relies on the fact that any target asymmetry results in a different aligned position per wavelength. Thereby, by measuring this difference in aligned position for different wavelengths, the asymmetry can be determined, from which it is possible to extract an overlay value. Using a typical µDBO target with different biases per quadrant, it should be possible to separate the asymmetry due to overlay with any other asymmetry (e.g., grating asymmetry of one of the gratings), using methods similar to those already employed in µDBO metrology.

Other Metrology Applications—Intensity Based

In addition to phase based measurements comprising the imaging of interference patterns and the position of interference fringes on the camera, the proposed metrology device can also be used for intensity based metrology. This has two main applications. A first application is to measure and correct for asymmetry in alignment marks as part of an alignment measurement (such as described). A second application provides an alternative method for measuring overlay from presently used µDBO targets (or µDBF targets), to that described in the previous section.

To understand how this can be achieved, consider first the measurement of a perfectly symmetric target (e.g., an alignment mark of the form shown in FIG. 4(a)) using the metrology device described herein. It can be shown that the (e.g., average) intensity level for each quadrant is equal. Consider now the same measurement, but on a target where one quadrant (e.g., an X direction quadrant) has asymmetry, all other quadrants being symmetric. In this case, the image quadrant corresponding to the asymmetric target quadrant will show a phase shift in the fringe pattern (which could be interpreted as a different alignment position) and a reduced fringe contrast/fringe visibility. Additionally, the two image quadrants corresponding to X-direction target quadrants may show an intensity imbalance. It is proposed to exploit this to measure the asymmetry.

An overlay mark imposes an asymmetry between +1 and −1 orders for both intensity and phase (i.e., an intensity asymmetry and a phase asymmetry). Typically, in DBO metrology, only the asymmetry in intensity is measured. An advantage of the metrology device described herein is that both the intensity asymmetry and the phase asymmetry can be measured (at the same time), since asymmetry in the phase results in shift of fringe pattern. This is useful as intensity asymmetry and phase asymmetry are complementary to each other. By measuring both asymmetries, it becomes possible to efficiently measure overlay for any combination of wavelength and stack thickness. By comparison, the sensitivity of intensity (only) asymmetry to overlay is highly wavelength dependent, and therefore only works for a subset of wavelengths, the subset being dependent on the stack.

The asymmetry in intensity can be measured by separating +1 and −1 orders in different images, as is presently done in dark-field DBO metrology. Alternatively, the intensity asymmetry may be inferred from the interference fringe contrast, as these are directly related. If there is intensity asymmetry, then there will not be perfect destructive interference, such that the fringe contrast is less than one.

Figure 10A:
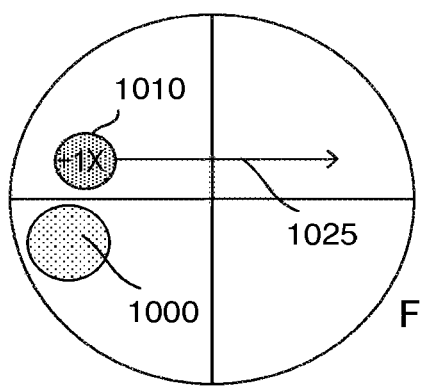
FIGS. 10(a)-10(h) illustrates various methods of measuring asymmetry in a target using the metrology device of FIG. 2 according to embodiments.
Figure 10B:
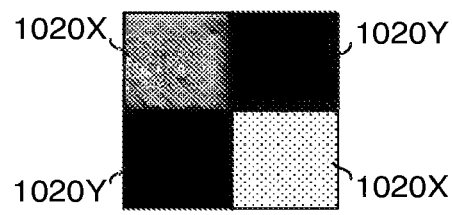
Figure 10C:
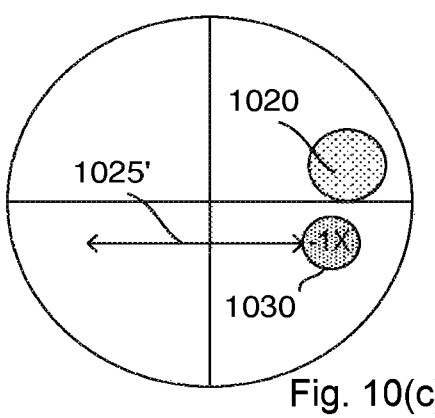
Figure 10D:
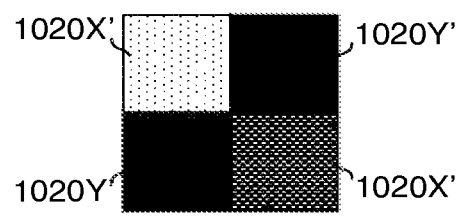

In a first embodiment, it is proposed to use selective illumination modes such that only a single higher diffraction order is captured at any one time (wedges could also be used to separate the orders). FIG. 10(a) shows a first proposed illumination mode where only one off-axis beam 1000 illuminates the target and therefore only the +1 X direction order 1010 is captured. The resultant image is shown in FIG. 10(b). There are regions of intensity (no fringe pattern is visible as only the +1 diffraction order is present) in the two X-direction quadrants 1020X, with a clear intensity difference between these two quadrants visible (illustrated here in a difference in shading, with lighter shading being indicative of greater intensity). The Y-direction quadrants 1020Y are not visible (substantially zero intensity) as no Y-direction diffraction orders were captured. FIG. 10(c) shows a second proposed illumination mode where a different off-axis beam 1020 is selected to illuminate the target such that only the −1 X direction order 1030 is captured. The resultant image is shown in FIG. 10(d). Once again, the two X-direction quadrants 1020X' show a clear intensity difference and the two Y-direction quadrants 1020Y' are not visible. It will be appreciated that the same principle can be used to capture only single Y-diffraction orders to determine the Y quadrant asymmetry. Overlay can then be inferred from differences between opposing +1 and −1 diffraction orders (e.g., the intensity difference for quadrants 1020X and 1020X' for one or both corresponding pairs of quadrants) in the same manner as presently done in DBO.

Figure 10E:
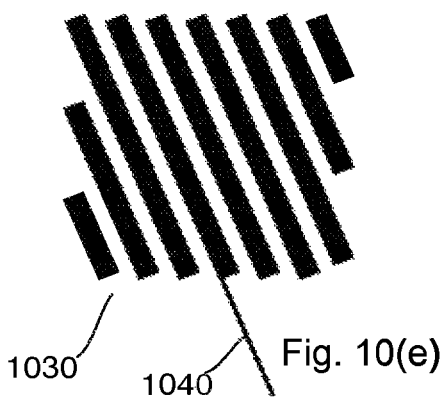
Figure 10F:
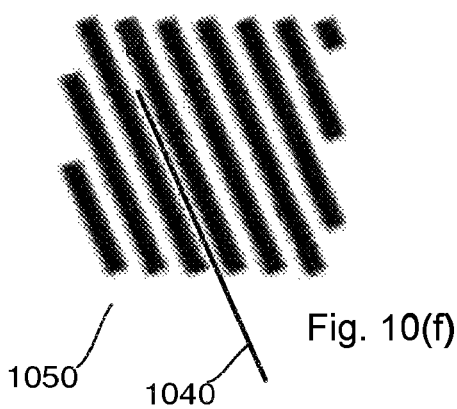

In a second embodiment, the +1 and −1 diffraction orders interfere and form an interference fringe pattern on the camera such as described in FIG. 4(d) and FIG. 5, and the overlay is inferred from the fringe contrast, or preferably from a combination of fringe position (phase asymmetry) and fringe contrast (intensity asymmetry) due to overlay, in a single measurement. Such an embodiment is schematically illustrated by FIGS. 10(e) and 10(f). FIG. 10(e) shows an interference fringe pattern 1030 resultant from measuring an overlay target with no asymmetry (zero overlay). FIG. 10(f) shows an interference fringe pattern 1050 resultant from measuring the same overlay target, but where there is an asymmetry (e.g., non-zero overlay). It can be seen that there is a shift in the fringe position (e.g., with respect to fixed reference 1040 which is at the same position for both Figures). It can also be seen that the fringe contrast is lower for interference fringe pattern 1050 with respect to interference fringe pattern 1030 (e.g., the fringes are more blurred in fringe pattern 1050). The measurement of both the interference fringe shift, and/or the change in image contrast, can be used to measure overlay from the target (e.g., it can be assumed that both vary monotonically or linearly with overlay).

In all these asymmetry embodiments, deliberate offsets can be implemented in the target to distinguish the overlay from other processing asymmetries in a known manner. For example, by measuring standard µ DBO targets (i.e., with two quadrants per direction each having a different bias), it is possible to measure overlay based on the determined asymmetry while correcting for target asymmetries other than overlay, in a manner analogous to µDBO techniques used presently.

The above approaches can also be used to determine, and/or correct for, alignment mark asymmetry in an alignment measurement. Additionally, the proposed metrology tool allows this asymmetry correction to be performed within the mark itself (region-of-interest (ROI) selection). The ROI can be specified to apply different fitting routines (for more on ROI selection, refer to the section entitled Variable Region of Interest Selection). In this manner, it is possible to correct for deformations within the mark itself.

Also, it will be appreciated that, as this method comprises measuring target asymmetry, it can be used to measure other target asymmetry based parameters, such as measurement of focus or dose via targets designed with a focus or dose dependent asymmetry (e.g., DBF or µDBF targets).

Referring back to FIG. 10(a), it can be appreciated that (for at least the prism based off-axis illumination generator of FIG. 7(d)) the +1 X-direction order is confined to move along the arrow 1025, as a function of pitch and wavelength. It will therefore be confined to a movement along the top two quadrants of the pupil. Similarly, the −1 X-direction order is confined to move along the arrow 1025' as a function of pitch and wavelength, and is therefore confined to a movement along the bottom two quadrants of the pupil. For a phase-grating based off-axis illumination generator, the order will only move in the indicated direction (along arrow 1025 or 1025') as function of grating pitch, and changing the wavelength will cause the diffraction orders to move towards or away from the center of the pupil. As such, the movement is confined to only one quadrant for a phase-grating based off-axis illumination generator, as a function of wavelength (but still two quadrants as a function of pitch).

Figure 10G:
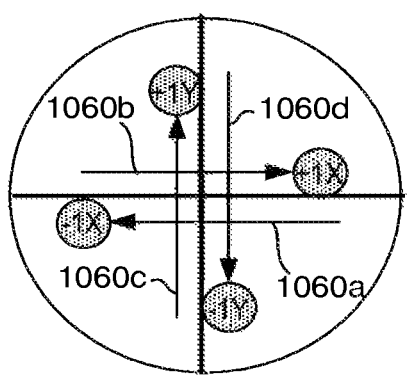

FIG. 10(g) shows the situation with respect to a 2D mark, having with X and Y direction orders (e.g. a µDBO mark or similar). The −1 X-direction order is constrained to locations along arrow 1060a, the +1 X-direction order is constrained to locations along arrow 1060b. The +1 Y-direction order is constrained to locations along arrow 1060c (left quadrants only), the −1 Y-direction order is constrained to locations along arrow 1060d (right quadrants only). Therefore, for a given pitch and wavelength, there is only a single X- or Y-order per quadrant (assuming same pitch in X and Y direction gratings).

This can be exploited, in one embodiment, by placing four optical wedges at the pupil plane (plane P3 as shown in FIG. 2). The concept of optical wedges to simultaneously image multiple orders in scatterometry metrology is described, for example, in US2011/0102753 and US2012/0206703, both of which are hereby incorporated by reference. The +1 order and −1 order diffracted beams in both direction are directed to different parts of the camera by the wedges, where they are imaged. An advantage of this is that less light is wasted (blocked) than when using a quartered illumination aperture, improving the signal.

Figure 10H:
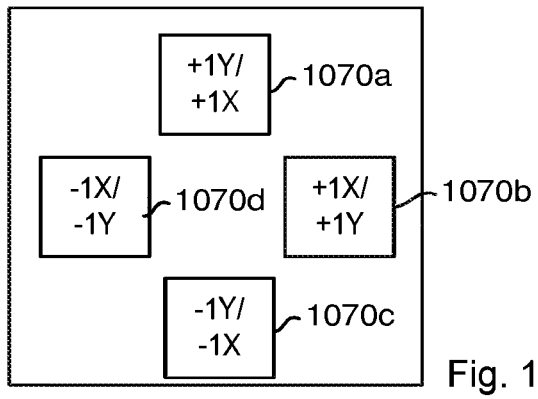

FIG. 10(h) schematically illustrates the resultant image, comprising a sub-image per quadrant. Depending on the pitch/illumination combination, all of the sub-images 1070a-1070d will be comprised of the first listed diffraction order or of the second listed diffraction order. In this specific example, for a first pitch/illumination combination, first sub-image 1070a is formed from the +1 Y-direction order, second sub-image 1070b is formed from the +1 X-direction order, third sub-image 1070c is formed from the −1 Y-direction order and fourth sub-image 1070d is formed from the −1 X-direction order. For a second pitch/illumination combination (e.g., a much smaller pitch), first sub-image 1070a is formed from the +1 X-direction order, second sub-image 1070b is formed from the +1 Y-direction order, third sub-image 1070c is formed from the −1 X-direction order and fourth sub-image 1070d is formed from the −1 Y-direction order. ROI selection could be applied to this image (see below) to obtain measurement values for each order.

Furthermore, since each sub-image contains only a +1 order or −1 order, it is possible to create intensity channels that could be used to correct for mark asymmetries. This may comprise separate monitoring of intensity channels relating to each captured diffraction order. The intensity difference between +1 and −1 orders can be used as a fingerprint for (mark) asymmetry. Based on this fingerprint, it is possible to determine a correction for the aligned position which mitigates this asymmetry. In previous photodiode based alignment sensors, it was not possible to determine whether detected radiation originated from the mark or otherwise, and therefore the spot had to underfill the mark. With a camera-based metrology device as described herein, it is possible to distinguish from where radiation has originated, and therefore both overfilling and underfilling the marks is possible.

In another embodiment, the four optical wedges are replaced by gratings. These gratings may be optimised to direct only all zeroth order and all first order diffracted beams onto the camera. With such an arrangement, an additional sub-image (fifth sub-image) is created from all zeroth order beams. These zeroth order beam can interfere to form an interference fringe pattern on the camera, which can be interpreted using the methods already described. This fifth sub-image, may be located centrally in the image plane, for example (e.g., centrally with respect to sub-images 1070a-1070d in FIG. 10(g)). Therefore, this method allows for a simultaneous detection of an interference fringe pattern and corresponding first order diffraction pattern on the camera. This enables simultaneous detection of phase and intensity. Any source induced metrology errors can be actively monitored and effectively decoupled from the measured data. The accuracy of the metrology system can thus be improved.

Variable Region of Interest Selection

Small targets, such as those for which the proposed metrology device is designed to measure, typically suffer deformations during their formation (e.g., due to processing). These deformations may lead to e.g., random edge effects, wedging over the mark, local grating asymmetry variations, local thickness variations and/or (local) surface roughness. When performing substrate alignment on deformed marks, averaging over the whole mark or over a fixed region of interest will typically lead to alignment errors.

Figure 11:
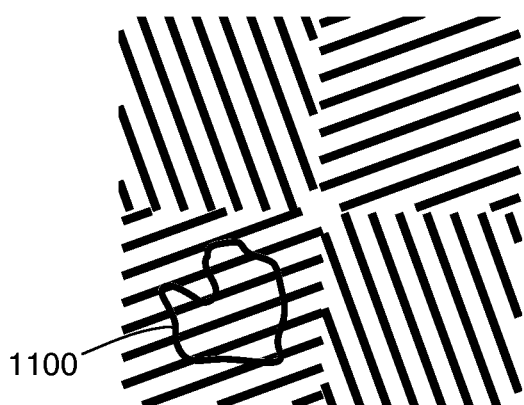
FIG. 11 shows schematically an arbitrary shaped region of interest selected for interpretation of an interference pattern, according to an embodiment.

It is therefore proposed to use variable region of interest (ROI) selection and variable pixel weighing to enhance accuracy/robustness. Instead of determining the alignment position based on the whole (e.g. µDBO) mark image or on a fixed region of interest (such as over a central region of each quadrant or the whole target; i.e., excluding edge regions), it is proposed to optimize the ROI on a per-target basis. The optimization may be performed per quadrant, for example. The optimization may determine an ROI, or plurality of ROIs, of any arbitrary shape. FIG. 11 shows an example of such an arbitrary shaped ROI 1100, purely for example.

It is also proposed, as a further option, to determine an optimized weighted combination of ROIs, with the weighting assigned according to one or more quality metrics or key performance indicators (KPIs).

As such, it is proposed to select an optimized area (ROI) or weighted pixel combination on a target-by-target basis, based on one or more KPIs, where example KPIs may comprise one or more of:

Local uniformity of the image;
Local uniformity of the (local) alignment position determined from the image;
Minimal local color-to-color image variation;
Minimal local color-to-color alignment position variation;
Minimal local shift-between-orders (for >1 μm pitches only);
Maximum local fringe contrast;
Measured or modelled alignment/overlay (or device performance) as a function of selected ROI;
Any other KPI that is empirically found to lead to improved alignment, overlay or other metric.

Multiple Target Imaging

The proposed metrology device, as already discussed, can be used as an alignment sensor to measure position of a substrate during a lithographic patterning process. Typically, a scanner can only align with respect to a single chosen layer. It is then assumed (or known from e.g. previous overlay measurements) that alignment with respect to the other layers is also acceptable. However, it would be more direct if a layer (e.g., layer N) could be directly aligned with respect to some or all relevant previous layers. It is therefore proposed to align on multiple marks in different layers in a single image capture using the metrology devices described herein. For example, layer N may require alignment (most critically) with respect to layer N-1 in the X-direction and, at the same time, with respect to layer N-2 in the Y-direction. It may even be the case that layer N needs to be aligned with respect to multiple layers in each direction. For example, layer N may need to be aligned with respect to layers N-1 and N-3 in the X-direction and with respect to layers N-2 and N-4 in the Y-direction. This may lead to quite complicated alignment trees.

Figure 12:
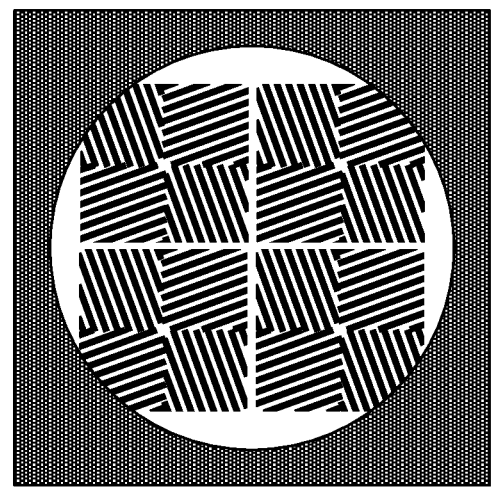
FIG. 12 shows schematically interference patterns of four targets measured in a single image capture, according to an embodiment.

FIG. 12 shows an example image of four alignment marks, each typically located in a different layer. The four marks are captured simultaneously within the field of view of a single image. The responses of the four marks can be separated by region of interest (ROI) selection, so that each mark can be analyzed separately. For example, alignment positions can be determined for each mark (and therefore each layer) separately. An optimal exposure position can then be determined from these multiple alignment positions. An example strategy for determining the optimal exposure position may comprise taking the average alignment position (average over the relevant layers). If the alignment with respect to a certain layer is more critical than with respect to another layer, a weighted average may be taken, where the more critical layer is assigned a greater weight.

While the multiple imaging concept is described in terms of alignment, it is also applicable for other metrology techniques such as determining multiple overlay values relating to different layer pairs. Overlay correction can then be optimized for multiple pairs of layers simultaneously.

Polarization Resolved Imaging

Figure 13:
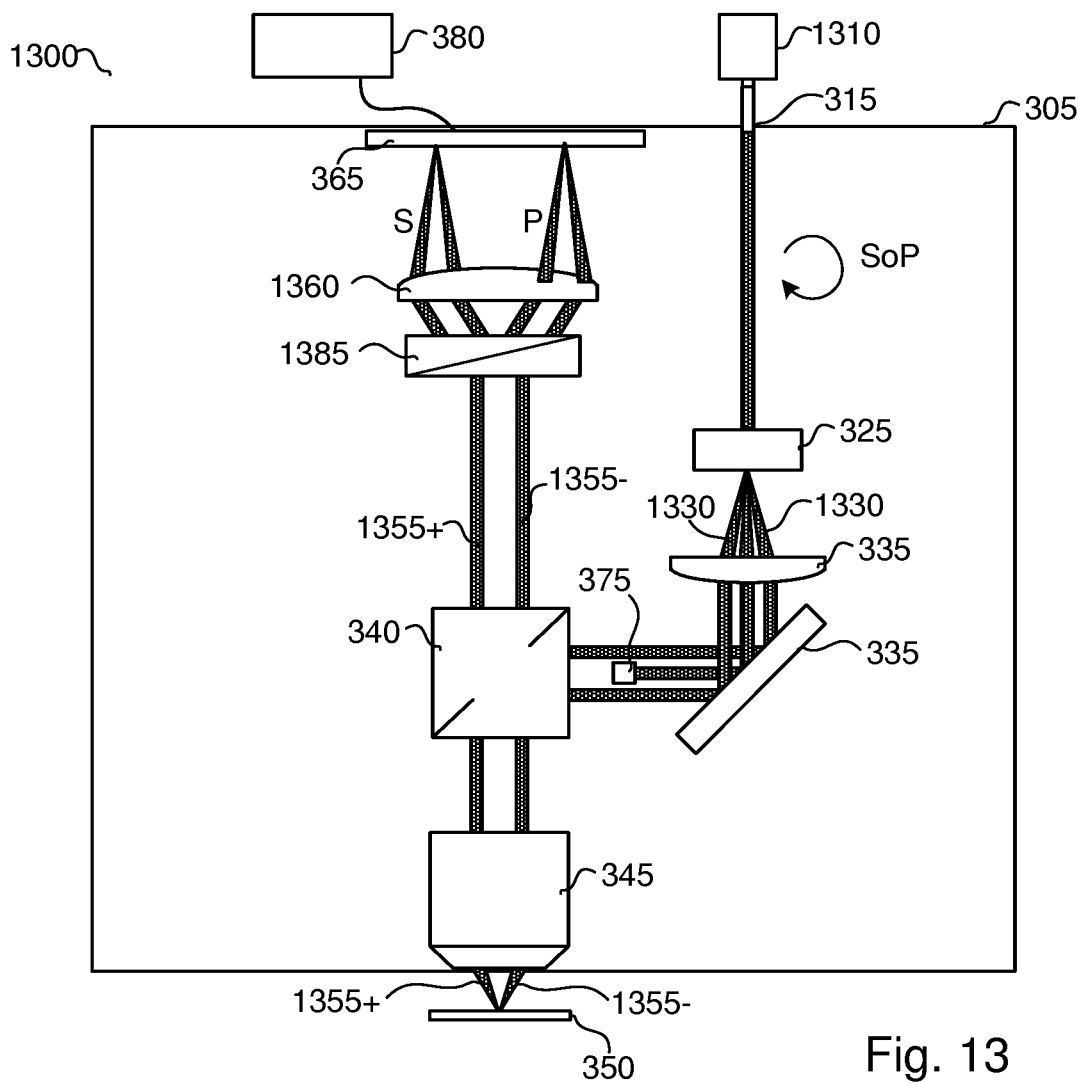
FIG. 13 is a schematic illustration of a metrology device according to a second embodiment of the invention.

FIG. 13 shows an embodiment of the metrology device 1300 described herein, operable to obtain polarization resolved images. The components common with the device of FIG. 2 will not be described again, and some of the optical components have been removed from the drawing for simplicity. It is known that the ability to obtain a polarization resolved signal (both for overlay and alignment) allows for more process robust measurements. In this embodiment, the illumination source 1310 is assumed to be spatially incoherent with a known State of Polarization (SoP). This SoP could be, for example, circular, diagonal or (most likely) unpolarised. Two coherent off-axis beams 1330 are generated (e.g., per direction) in a manner described and enter a (e.g., high NA) objective lens 345. The radiation is focused on a target on substrate 350 and only the +1st and −1st diffracted orders 1355+, 1355− (per direction) are collected by the objective. The diffraction orders 1355+, 1355− are incident onto a Wollaston prism 1385 (or any other suitable polarization separator element such as a wire-grid polarizer) which separate the light in the orthogonal S and P SoP components, with an angular displacement given by the separation angle between the ordinary and extraordinary axis. The beams are then focused by an imaging lens 1360 such that two images, related respectively to the S and P component of the target's scattered illumination, are captured by the camera 365.

Pump-Probe Illumination

An embodiment of the proposed metrology device may implement a pump-probe (acoustic) illumination mode, in an embodiment. Such a mode may be useful, for example, where alignment marks, or other metrology targets, are located beneath very optically opaque layers (e.g., opaque even to infra-red). Pump-probe measurements can also be useful in applications without (very) opaque layers, as it enables resolution of smaller grating pitches, which is beneficial in terms of accuracy and processing. Furthermore, the sensitivity of pump-probe measurements to variables such as (for example) layer thickness variation, grating asymmetry, underlying structures, etc., is very different compared to that of standard optical measurement methods. This can enable increased measurement accuracy.

In a pump-probe illumination method, the alignment marks are illuminated by one or a series of pump pulses, followed by one or a series of probe pulses. The pump pulses will firstly excite an acoustic shock wave (e.g., having a typical acoustic wavelength of 10-100 nm). The excited acoustic plane wave will 1) propagate into the substrate stack; and 2) be reflected by the buried mark grating; and 3) propagate back to the surface of the opaque layer and/or the resist layer or layers covering the mark, resulting in a measurable periodic surface deformation pattern and/or refractive index variation (e.g., an effective acoustic grating). The periodic surface deformation and/or refractive index variation pattern can be measured using any of the techniques described via the "probe" pulse or measurement pulse.

FIG. 14 schematically illustrates such an illumination method at four consecutive time instances. FIG. 14(a) shows the pump pulse 1400 being incident on a stack 1405 which comprises an opaque layer 1410 and buried mark (grating) 1415. The pump pulse 1400 generates an acoustic wave 1420. FIG. 14(b) shows the acoustic wave 1420' at a later time as it propagates through the stack. The acoustic wave reflects off the buried mark 1415, with the reflected acoustic wave 1420" being shaped by the buried grating (FIG. 14(c)). Finally, FIG. 14(d) shows the reflected acoustic wave 1420'" at the surface, manifesting as a shallow surface deformation with a periodic variation in refractive index. The periodic surface deformation pattern acts essentially like a grating for the incoming probe pulses 1425. The probe pulses 1425 will then interact with the deformation pattern generated by the reflected acoustic wave 1415'", and the diffracted probe pulses 1430 will be captured and imaged by a camera. The camera images will show similar interference patterns as illustrated in FIG. 5, and hence same image analysis can be performed as already described to evaluate the substrate alignment.

In FIG. 14(a), an on-axis pump pulse 1400 is illustrated, which uniformly illuminates the buried mark 1415. The off-axis probe beams 1425 are configured as illustrated in FIG. 2 and previously described. The smallest grating pitch which can be resolved in this manner is two times smaller than a conventional (on-axis) sensor. To understand why this pitch reduction is possible, it should be appreciated that a Moiré pattern will be generated: the probe pulse forms a grating pattern on the substrate. This grating interacts with the acoustic grating generated by the pulse. The frequencies mix and therefore (2×) smaller pitches can be resolved.

FIG. 14(e) illustrates another embodiment, where off-axis pump beams are used. Instead of illuminating the alignment mark 1435 uniformly as described in the above-mentioned embodiment, the off-axis pump beams generate a 2D grating pattern on the top surface of the substrate. In such an arrangement, the acoustic waves are only excited at the locations where the pump beams are constructively interfered. The excited 2D acoustic plane waves propagate through the substrate stack and get reflected by the buried alignment mark 1435, e.g., μDBO grating. The wave-fronts of all the reflected acoustic waves are shaped by the grating and form a surface deformation pattern 1440. After interacting with this surface deformation pattern 1440, essentially a 2D grating pattern, the diffracted off-axis probe beams 1440 will interfere with each other at the camera. The interference patterns will then be captured and analyzed to evaluate the substrate alignment. It can be seen that the pitch surface deformation pattern 1440 is twice as large as the pitch of the buried alignment mark 1435. This is because the pump excites acoustic waves with a grating pattern. The acoustic grating interacts with the buried alignment grating. The frequencies mix and the acoustic grating that appears at the surface has e.g. 2× larger pitch than the buried grating. This effect is combined with the previously described Moiré effect caused by interaction of the probe pulse and acoustic grating, leading to the possibility of 4× smaller pitches being resolved compared to standard techniques. This assumes linear acoustics. If the acoustic excitation and/or propagation and/or detection are considerably non-linear then, in theory, infinitely small pitches (e.g., product pitches) can be resolved.

While all the examples describe integer pitch ratios (e.g., 2× and 4×), the method is equally applicable for non-integer ratios; i.e., where the grating pitch and illumination pitches are incommensurable with respect to each other.

In an embodiment, one or more properties of the pump pulse(s) and/or probe pulse(s) are optimized to enhance nonlinear acoustic generation and/or propagation and/or detection effects. This can improve signal strength when measuring on very small (normally not resolvable) target pitches.

Tunable Asymmetry for Intensity Balance Optimization

An aligned position value or overlay value using the metrology device described herein is sensitive to asymmetry (such as process asymmetry) in the target (e.g., a diffraction grating). Such target asymmetry may, generally speaking, be estimated through methods such as multi-color comparison; or measurement of the intensity imbalance between +1 and −1 diffraction orders (e.g., via angle resolved metrology). However, the performance of such methods suffers if the sensor imposes additional asymmetry into the measurement: A cross-term between the sensor asymmetry and grating asymmetry is difficult to resolve.

To address this issue, an asymmetry tuning arrangement is proposed which enables tuning of asymmetry of the illumination. Such an arrangement is proposed for any of the metrology tools described herein, and more specifically for the metrology tools for which the off-axis illumination generator comprises at least one phase grating. The asymmetry tuning arrangement may be implemented using a dual grating off-axis illumination generator, which further comprises a second grating that can be moved with respect to the first grating. This may be effected by making the first grating movable, the second grating movable or both first and second gratings movable.

Figure 15A:
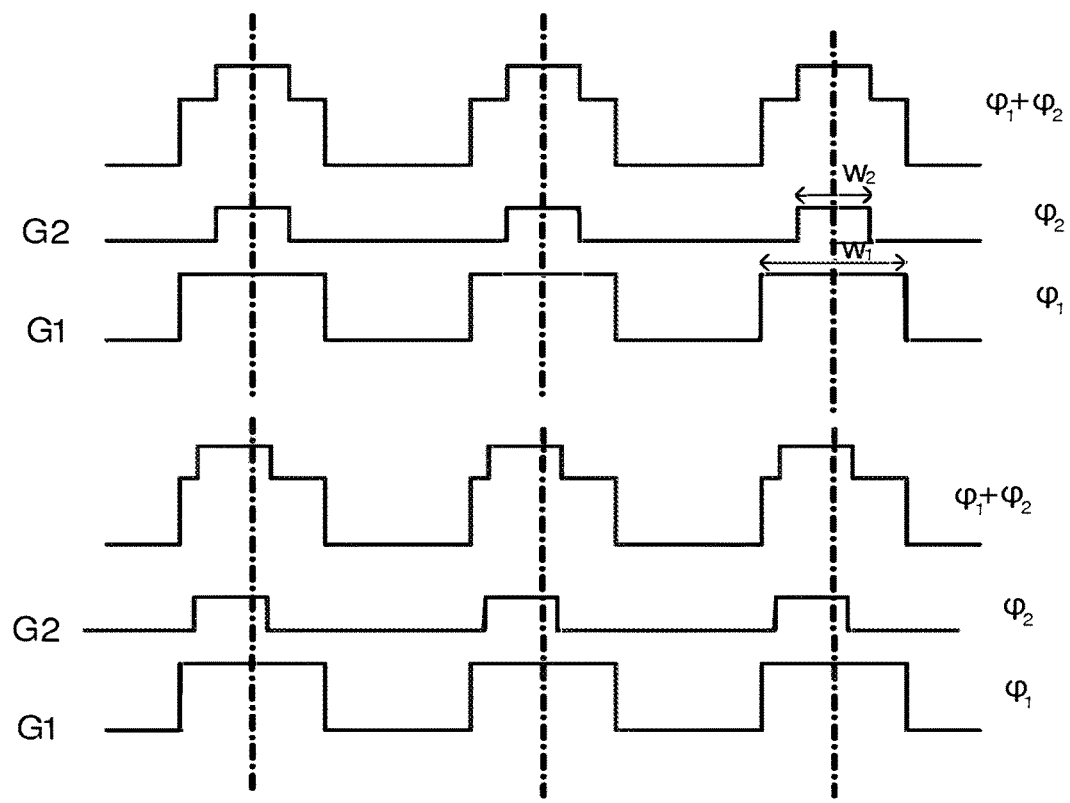
FIGS. 15(a)-15(b) illustrate 5(a) phase profiles relating to a dual grating off-axis illumination generator for asymmetry optimization; and 5(b) an associated swing curve of diffraction efficiency against phase depth.

The basic operation principle is shown in FIG. 15(a). A first grating G1 with first phase depth $\varphi_1$ and first feature width or linewidth $w_1$ generates the diffraction orders (e.g., the off-axis illumination beams) as has been described. A second grating G2 with second phase depth $\varphi_2$ and second feature width or linewidth $w_2$ is placed in close proximity to the first grating G1. In this context "close proximity" should be taken to mean being sufficiently close that the Kirchoff mask approximation is valid, such that the sum of two phase mask formed by the two gratings in close proximity is the sum of the individual phase depths.

Shifting the position of second grating G2 relative to first grating G1 creates an asymmetry in the total phase profile $\varphi_1+\varphi_2$. In FIG. 15(a), the top plot shows the first grating G1 and second grating aligned symmetrically such that the total phase profile $\varphi_1+\varphi_2$ is symmetrical and the second plot shows the result of shifting second grating G2 with respect to first grating G1 such that the total phase profile $\varphi_1+\varphi_2$ is asymmetrical.

The amount of asymmetry may be controlled by design through the relative phase depth and linewidth $w_2$ of second grating G2; and by adjustment of the offset of second grating G2 relative to first grating G1. The design of second grating G2 can be optimized (e.g., in terms of phase depth and linewidth) to provide a desired range of intensity imbalance, while at the same time providing a large position adjustment range. In order to make the control sensitivity large (small change in asymmetry for large physical movement), the phase depth of grating G2 may be chosen to be the smallest possible which allows sufficient range. In order to achieve asymmetry via a shift of grating G2, grating G2 may be provided with at least one of the two properties:

the gratings have different linewidths (e.g., $w_2$ is smaller than $w_1$); and/or the gratings have different phase depths (e.g., $\varphi_2$ is smaller than $\varphi_1$).

The asymmetry tuning arrangement can be used to correct for intensity asymmetry in the sensor, resulting from one or both of: 1) intensity asymmetry resulting from grating asymmetry; or 2) intensity asymmetry caused by the optics (sensor asymmetry).

The asymmetry tuning arrangement may be implemented with an actuator in the sensor to enable periodic tuning of the intensity balance to compensate for drift and/or specific use of the sensor.

Figure 15B:
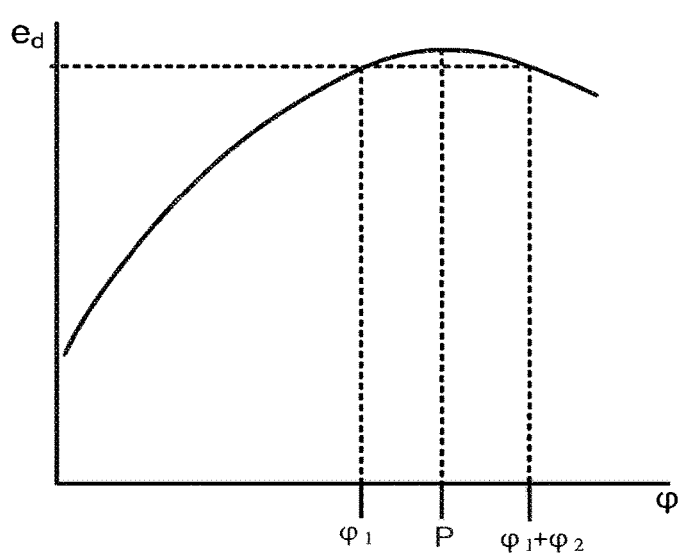

In a secondary optimization, the phase depth $\varphi_1$ of first grating G1 and phase depth $\varphi_2$ of second grating G2 may be chosen such that the diffraction efficiency is the same with and without the second grating G2, but on opposite sides of the peak P of a swing curve of diffraction efficiency $e_d$ against phase depth $\varphi$. Such a curve is shown in FIG. 15(b). This may be implemented by detuning the absolute phase of first grating G1 from the optimal phase depth such that the additional phase depth of grating G2 is on the opposite side of the swing curve peak. This minimizes the impact of the 'center of gravity' shift for the combined grating, thereby minimizing the relative phase shift of the diffraction orders. The downside of this is secondary optimization is that it can be optimized for only a single wavelength, which limits its usefulness.

Instead of generating tunable asymmetry of the illumination by shifting the position of one grating (e.g., second grating G2) relative to the other (e.g., first grating G1), tuning of asymmetry of the illumination can also be obtained by shifting the two gratings together with respect to the illumination beam. According to an embodiment, a first grating G1 with first phase depth $\varphi_1$ and first feature width or linewidth $w_1$ generates the diffraction orders (e.g., the off-axis illumination beams) as has been described. A second grating G2 with second phase depth $\varphi_2$ and second feature width or linewidth $w_2$ is placed on top of and in close proximity to the first grating G1. The second grating G2 may be directly printed on top of the first grating G1. Alternatively, the two gratings (G1 and G2) may be formed on two separate optical elements (e.g., thin glass). Such two optical elements are subsequently bonded together such that the second grating sits on top of and in close proximity to the first grating.

In both cases, the two gratings are located in two parallel planes that are perpendicular to the incident illumination beam and fixed in position with respect to each other (i.e. no relative movement is allowed). The period of the second grating G2 is chosen to be close to but slightly different from that of the first grating G1. In such a manner, different Moire patterns can be generated by introducing different lateral and/or angular offsets between the two gratings. Both lateral and angular offsets are introduced in the grating plane and evaluated between two sets of grating structures (e.g., grating lines). A lateral offset means the spacing between the two sets of grating structures is changed while the two sets of grating structures remain to be parallel to each other. In contrast, an angular offset means one grating is rotated with respect to the other such that an angle is formed between the two sets of grating structures.

Depending on the parameters of the incident illumination beam, e.g., the size of the illumination beam, a suitable Moire pattern can be selected by introducing an appropriate amount of offset between the two gratings. When the two gratings are moved together with respect to the incident illumination beam, the illumination beam sees a different part of the Morie pattern and as a result a different amount of illumination asymmetry is generated. Since the grating structures and their relative offset are pre-determined, the Morie pattern formed by the two gratings can be used to create an asymmetry map, with which an automated tuning of asymmetry of the illumination can be achieved. It is noted that areas of the asymmetry map where the illumination beam experiences significant asymmetry changes should be avoided.

In a further embodiment, an asymmetry tuning arrangement may be implemented by locating a variable attenuator in the path (e.g., in the pupil) of one beam of each of the illumination beam pairs (e.g., per direction).

Increased Functionality Hardware Embodiment

Figure 16:
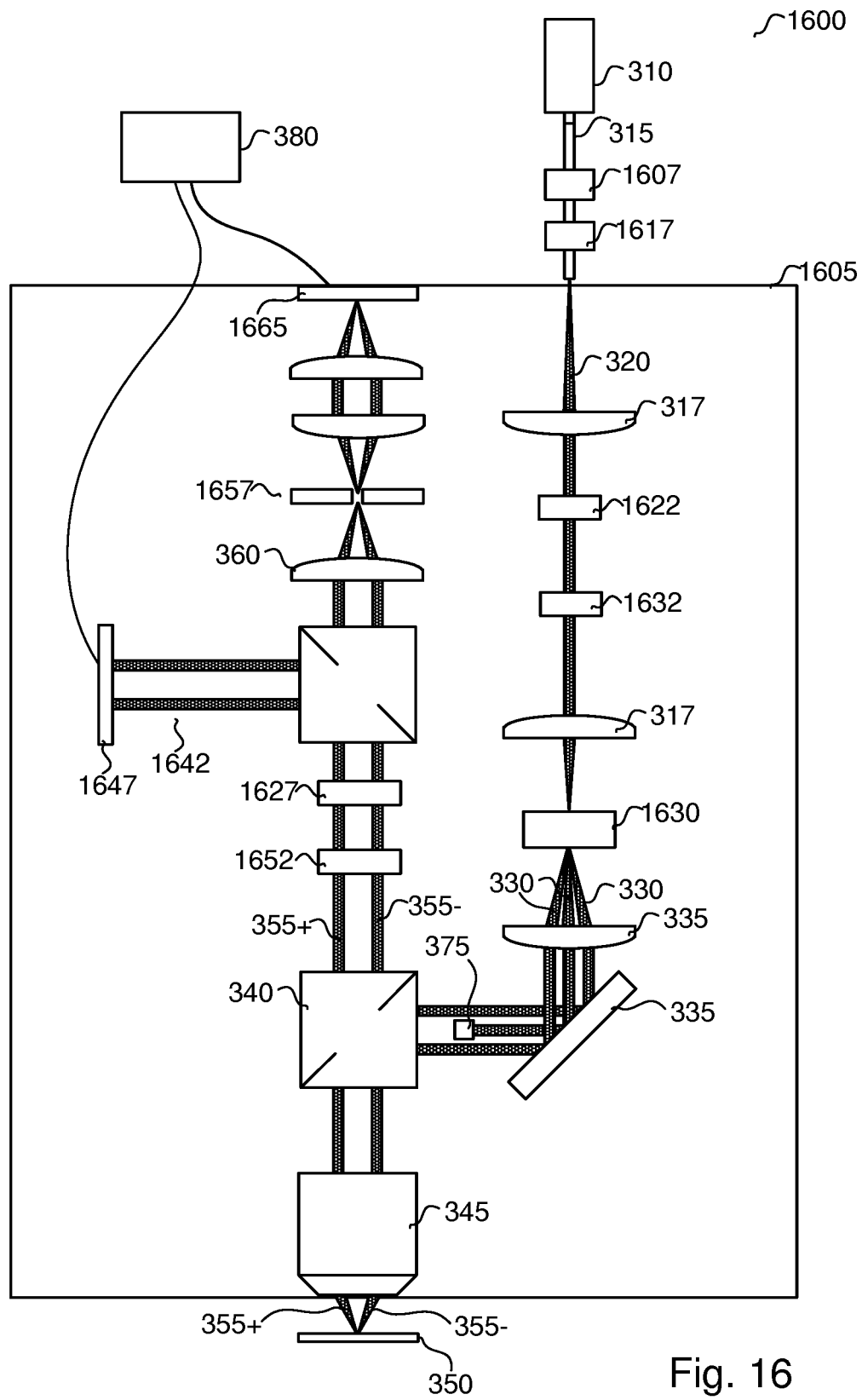
FIG. 16 is a schematic illustration of a metrology device according to a third embodiment of the invention.

FIG. 16 comprises a further embodiment of the metrology device 1600 described herein, having a number of additional features over the metrology device 300 illustrated by FIG. 2. Each of the additional components and features can be implemented separately. The components common with the device of FIG. 2 will not be described again. The metrology device 1600 comprises an illumination tuning component 1607 at the output of the incoherent illumination source 310. Illumination tuning component 1607 enables tuning of the illumination wavelength or spectrum, such that wavelength characteristics (e.g., central wavelength, bandwidth and/or wavelength combinations) of the illumination can be selected (e.g., to be most process robust for a specific target). As such, for example, the illumination tuning component 1607 may comprise an acousto-optic tunable filter (AOTF). All wavelengths could be projected on one camera 1665 or multiple wavelength-resolved cameras (not shown). A tunable power component 1617 may also be provided to enable tuning of the input illumination.

Within the optical module 1605, polarization components 1622, 1627 are provided. The polarization components 1622, 1627 comprise, for example a tunable polarizer 1622 for tuning the polarization (e.g., to linear, circular or incoherent) of the input beam and a (e.g., cross-) polarization detector 1627. It is known that the combination of illumination polarization, target and detection polarization can affect the detected mark position. Therefore, these components 1622, 1627 enable variation of these polarization parameters to improve process robustness.

Pupil illumination mode component 1632 defines and configures the illumination pupil for a measurement. This may comprise the ability to switch on or off any of the off-axis illumination beams. One application for such functionality has already been described in the section headed Other Metrology Applications—Intensity based. Additionally, for X direction targets with large pitches, it may be desirable to illuminate from one angle, such that the resulting interference pattern comprises only the interference of the 1st and 3rd orders, for example. This may make it easier to analyze the interference pattern, and reduce aberrations. Alternatively, it might also be beneficial to have only conjugate illumination pairs switched on at any one time. The pupil illumination mode component 1632 may also be configured to block unwanted scattered orders in the illumination pupil. Equivalent functionality may also be provided (alternatively or in combination) in the detection pupil, e.g., using pupil detection mode component 1652.

Alternatively, or in addition, the pupil illumination mode component 1632 may be configure to vary coherence between non-conjugate off-axis illumination beams. For example, for measurement of the X-orientated quadrants, only the corresponding X diffraction orders are required. The equivalent is true for the Y-orientated quadrants. Image processing becomes more complicated if the X and Y diffraction orders also interfere. Such interference can be avoided by, for example: 1) imposing different wavefronts on the off-axis illumination beams corresponding to the X-diffraction orders with respect to the off-axis illumination beams corresponding to the Y-diffraction orders; or 2) providing for a path length delay that is longer than the coherence length between the off-axis illumination beams corresponding to the X-diffraction orders with respect to the off-axis illumination beams corresponding to the Y-diffraction orders.

A substrate illumination mode component may be implemented as part of the off-axis illumination generator 1630 or separately. The substrate illumination mode component defines and configures the illumination mode at the substrate. In particular, it provides for a tunable illumination spot size on the substrate. One application of such a tunable illumination spot size is to better implement a pupil metrology mode, as such a mode may benefit from having the illumination spot underfilling the target (to avoid unwanted scattering in overlapping pupil coordinates). As such, the metrology device 1600 also comprises a pupil imaging branch 1642, with corresponding pupil camera 1647.

In an embodiment, an illumination mode can be created such that e.g. X-grating segments on the wafer are only illuminated by e.g., the left-most and right-most beams in the pupil and the Y-grating segments on the wafer are only illuminated by e.g. only the top-most and bottom-most illumination beams in the pupil. Such an arrangement may have advantages in terms of sample heating/damage.

A calibration of the metrology device can be performed by imaging a reference target 1657, such as a Computer Generated Hologram GCH or pattern. This target should be carefully designed so it addresses the relevant Zernikes, and projects with sufficient information onto the camera 1665. The corresponding interference pattern is analyzed, such that the aberration profile of the optics is derived based on a comparison between the measured pattern and the expected pattern. A reference target 1657 design should be devised which addresses the relevant pupil coordinates corresponding to aberrations, and maps these onto the camera 1665. The corresponding interference pattern will undergo image analysis protocols to obtain the corresponding aberration map from the image. It is envisaged that such a method will work better if there are multiple wavelengths available. An alternative proposal for a custom target, would comprise using specific targets (e.g. gratings) which map to specific Zernikes. By providing such a target on the TIS plate, it is possible to calibrate all sensor aberrations each time that a stage align is performed. Combining this aberration map with the difference in aligned position for different wavelengths, there should be sufficient control parameters to correct for target imperfections.

The metrology device may also comprise an internal reference structure (i.e., inside the metrology device itself) which enables calibration of drift (of e.g. of the camera sensor) at relatively short timescales (e.g. shorter than the time between measuring a wafer stage fiducial and the final targets on the wafer). Such an internal reference structure may be such that the radiation travels as directly as possible from the reference structure to the camera, in order to only measure camera drift (without optical aberration). The internal reference structure position with respect to the wafer stage fiducial/metro frame should be accurately known and reliable (e.g., not subject to drift). For example, the internal reference structure may be thermally and vibrationally isolated from any heat dissipating and vibrating elements, including the camera.

Figure 17:
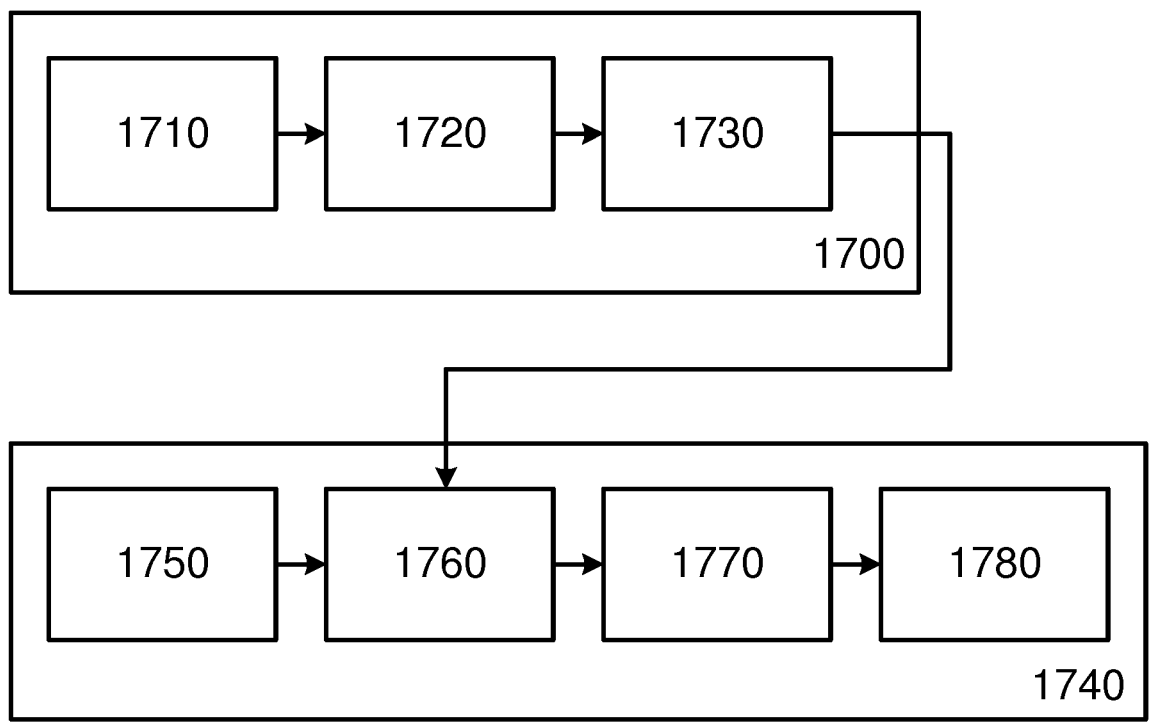
FIG. 17 is a flowchart describing a calibration to mitigate the effects of aberrations in the optics of a metrology device in accordance with an embodiment of the invention.

FIG. 17 is a flowchart describing an example of such a calibration method. Considering first a calibration phase 1700; at step 1710, the reference target (e.g., CGH) is measured with the metrology device. At step 1720 the raw image is processed, and at step 1730, the aberration fingerprint of the projection optics is determined. A measurement phase 1740, begins with measuring a target 1750. At step 1760, the aberration fingerprint determined at step 1730 is used to correct the image acquired at step 1750 for aberrations. At step 1770, the aligned positions for different wavelengths are compared to correct for local process artifacts. The output is the corrected aligned position 1780.

As mentioned previously, each individual feature of metrology sensor 1600 comprises an individual embodiment which can be implemented in isolation. As such, the proposed metrology device may comprise a metrology device of claim 1, and/or metrology device 300 of FIG. 2, with any one or more of the following features:

multiple wavelength functionality;
tunable wavelength/spectrum functionality;
aberration calibration;
within target correction;
pupil metrology and/or tunable spot size;
tunable polarization;
coherence optimization and tuning between non-conjugate illumination spots,
illumination mode selection;
tunable filters in illumination and/or detection pupil;
tunable power characteristics;
polarization resolved imaging;
multiple target imaging;
Variable Region of Interest Selection;
Phase based metrology;
Intensity based metrology;
Alignment metrology;
Overlay and/or Focus metrology;
Pump-probe illumination;
Dual grating off-axis illumination generator for asymmetry tuning;
Simultaneous multiple first order detection; and
Simultaneous multiple first order detection and zeroth order detection The terms "radiation" and "beam" used in relation to the metrology devices described herein encompass all types of electromagnetic radiation, in any wavelength range, including infrared wavelengths such as 1000-3000 nm wavelengths.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A metrology device configured to produce measurement illumination comprising:
   a plurality of illumination beams, each of the illumination beams being spatially incoherent or pseudo-spatially incoherent and comprising multiple pupil points in an illumination pupil of the metrology device,
   wherein each pupil point in each one of the plurality of illumination beams has a corresponding pupil point in at least one of the other illumination beams of the plurality of illumination beams thereby defining multiple sets of corresponding pupil points, and
   wherein the pupil points of each set of corresponding pupil points are spatially coherent with respect to each other.

2. The metrology device of claim 1, wherein each pupil point is substantially spatially incoherent with respect to all other pupil points in the same illumination beam.

3. The metrology device of claim 1, wherein each set of pupil points is a geometric translation of all other sets of pupil points within the illumination pupil, at least for the illumination beams corresponding to a considered measurement direction.

4. The metrology device of claim 1, comprising an off-axis illumination generator to generate the plurality of illumination beams of measurement illumination from a single beam of incoherent radiation.

5. The metrology device of claim 4, wherein the off-axis illumination generator comprises at least one phase grating for each measurement direction or a 2D phase grating.

6. The metrology device of claim 5, wherein the off-axis illumination generator comprises at least one pair of phase gratings for each measurement direction or 2D phase grating, at least one pair of lenses and at least one pair of optical wedges in a Fourier plane defined by one lens of the at least one pair of lenses, arranged such that different wavelengths within each illumination beam have a shared incident illumination angle.

7. The metrology device of claim 5, wherein the off-axis illumination generator comprises at least one pair of phase gratings comprising a first phase grating having a first phase profile and a second phase grating having a second phase profile, and arranged such that the second phase grating can be moved with respect to the first phase grating such that the combined phase profile comprises a tunable asymmetry.

8. The metrology device of claim 4, wherein the off-axis illumination generator comprises a beam splitter and a reflector arranged to generate four identical illumination beams from the single beam of incoherent radiation, and such that different wavelengths within each illumination beam have a shared incident illumination angle.

9. The metrology device of claim 1, wherein each illumination beam is located in the illumination pupil, such that a corresponding higher diffraction order is captured in a detection pupil of the metrology device for each illumination beam, following scattering of the measurement illumination by a periodic structure.

10. The metrology device of claim 9, wherein the plurality of illumination beams comprises a pair of illumination beams per considered measurement direction, and the corresponding higher diffraction orders captured comprise complementary higher diffraction orders for each direction.

11. The metrology device of claim 10, wherein the pupil points of each set of corresponding pupil points are spatially coherent with respect to each other for all of the plurality of illumination beams.

12. The metrology device of claim 10, wherein the pupil points of each set of corresponding pupil points are spatially coherent with respect to each other for only each pair of illumination beams corresponding to a single direction of the considered measurement directions.

13. The metrology device of claim 9, wherein the metrology device is operable in a dark field configuration such that a zeroth order of scattered radiation is not detected.

14. The metrology device of claim 9, comprising tunable filters in the illumination pupil and/or detection pupil, wherein the tunable filters are configured to tune one or more of: color, polarization, spatial distribution, and angular distribution.

15. The metrology device of claim 9, further comprising a detector operable to image an interference pattern resultant from interference of the higher diffraction orders.

16. The metrology device of claim 15, the metrology device being operable to determine positional information from the position of the interference pattern.

17. The metrology device of claim 16, wherein the metrology device is operable as an alignment sensor that is configured to measure position of a periodic structure on a substrate with respect to a fixed reference from the position of the interference pattern.

18. The metrology device of claim 16, wherein the metrology device is operable as an overlay metrology device and is configured to measure overlay from the relative positions of two interference patterns, each corresponding to a different periodic structure.

19. The metrology device of claim 15, wherein the measurement illumination comprises multiple wavelengths or wavelength bands.

20. The metrology device of claim 19, wherein the metrology device is operable to obtain separate images of each interference pattern corresponding to each of the multiple wavelengths or wavelength bands, and wherein the separate images are obtained sequentially on the same region of the detector, or simultaneously for each image on a different region of the detector or on different detectors.

21. The metrology device of claim 19, wherein the metrology device is operable to image the interference patterns corresponding to each of the multiple wavelengths or wavelength bands simultaneously on the same region of the detector, and is further operable to process the image by separating the interference patterns based on a different angle of orientation of each interference pattern.

22. The metrology device of claim 15, wherein the metrology device is operable to determine, for each periodic structure, one or more optimized regions of interest of the interference pattern.

23. The metrology device of claim 22, wherein the one or more optimized regions of interest are determined based on one or more characteristics of an image of the interference pattern and/or measured or modelled performance parameter values as a function of the optimized regions of interest.

24. The metrology device of claim 22, wherein the one or more optimized regions of interest comprise a plurality of regions of interest, each region of interest comprising a corresponding weighting based on one or more characteristics of an image of the interference pattern and/or measured or modelled performance parameter values as a function of the optimized regions of interest.

25. The metrology device of claim 15, wherein the measurement illumination comprises a known state of polarization, and the metrology device comprises a polarization separating element, and the metrology device is arranged to separately image polarization resolved interference patterns.

26. The metrology device of claim 15, wherein the metrology device is operable in different illumination modes wherein the measurement illumination comprises only a subset of the plurality of illumination beams.

27. The metrology device of claim 26, wherein the illumination modes include one or single beam modes wherein the subset comprises only a single one of the illumination beams.

28. The metrology device of claim 27, wherein the metrology device is operable to determine asymmetry in the periodic structure based on a detected intensity of scattered radiation detected using one or more of the single beam modes.

29. The metrology device of claim 28, wherein the detected intensity comprises a detected intensity difference between opposing higher diffraction orders obtained using two of the single beam modes, each single beam mode corresponding to one of the higher diffraction orders.

30. The metrology device of claim 15, wherein the metrology device is operable to determine asymmetry in the periodic structure based on a measure of the interference fringe contrast in the interference pattern.

31. The metrology device of claim 15, wherein the metrology device is operable to determine asymmetry in the periodic structure based on a measure of the position of the interference fringes in the interference pattern.

32. The metrology device of claim 1, further comprising a pseudo-spatially incoherent radiation source that produces radiation that mimics spatially incoherent radiation.

33. The metrology device of claim 32, wherein the pseudo-spatially incoherent radiation source comprises a laser source and a multimode generator for creating multimode radiation, the pseudo-spatially incoherent radiation source being operable to ensemble average different realizations of the multimode radiation so as to mimic spatially incoherent radiation.

34. The metrology device of claim 33, wherein the multimode generator comprises a rotating diffusor to create speckle patterns.

35. The metrology device of claim 33, wherein the multimode generator comprises a goniometer for scanning a single mode laser beam from the laser over different angles.

36. The metrology device of claim 1, wherein the metrology device is operable in a pump-probe illumination mode, to:

transmit one or more pump pulses to the substrate prior to one or more pulses of the measurement illumination, the one or more pump pulses being operable to excite an acoustic wave such that the acoustic wave reflects from a periodic structure being measured, resulting in a surface deformation and/or refractive index variation; and measure the surface deformation with the measurement illumination.

37. A lithographic apparatus comprising a metrology device of claim 1.

* * * * *